(12) United States Patent
Hasegawa et al.

(10) Patent No.: US 9,249,308 B2
(45) Date of Patent: Feb. 2, 2016

(54) COMPOUND HAVING BISAZO DYE SKELETON, PIGMENT COMPOSITION CONTAINING THE SAME, PIGMENT DISPERSION, INK, AND COLOR FILTER RESIST COMPOSITION

(71) Applicant: CANON KABUSHIKI KAISHA, Tokyo (JP)

(72) Inventors: Yuki Hasegawa, Yokohama (JP); Yasuaki Murai, Kawasaki (JP); Masatake Tanaka, Yokohama (JP); Takayuki Toyoda, Yokohama (JP); Masashi Kawamura, Yokohama (JP); Waka Hasegawa, Tokyo (JP); Masashi Hirose, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/357,196

(22) PCT Filed: Nov. 8, 2012

(86) PCT No.: PCT/JP2012/079590
§ 371 (c)(1),
(2) Date: May 8, 2014

(87) PCT Pub. No.: WO2013/069815
PCT Pub. Date: May 16, 2013

(65) Prior Publication Data
US 2014/0326931 A1  Nov. 6, 2014

(30) Foreign Application Priority Data

Nov. 10, 2011 (JP) .................................. 2011-246929

(51) Int. Cl.
*G02B 5/23* (2006.01)
*C09B 69/10* (2006.01)
*C09B 33/153* (2006.01)
*C09D 11/00* (2014.01)
*C09D 11/037* (2014.01)
*C09D 11/322* (2014.01)
*C09B 67/22* (2006.01)
(Continued)

(52) U.S. Cl.
CPC ............. *C09B 69/106* (2013.01); *C09B 33/153* (2013.01); *C09B 67/009* (2013.01); *C09B 67/0041* (2013.01); *C09D 11/00* (2013.01); *C09D 11/037* (2013.01); *C09D 11/322* (2013.01); *C09D 17/002* (2013.01); *G02B 1/04* (2013.01); *G03F 7/0007* (2013.01); *G03F 7/105* (2013.01); *G02B 5/223* (2013.01)

(58) Field of Classification Search
USPC .................. 106/31.52; 252/586; 430/108.22, 430/108.23; 524/189, 190, 217, 444; 525/153, 444; 526/208; 534/558, 561, 534/579; 560/34
See application file for complete search history.

(56) References Cited

U.S. PATENT DOCUMENTS 7,582,152 B2    9/2009  Jaunky et al.

FOREIGN PATENT DOCUMENTS

CN       001478130 A    2/2004
JP       11-14825 A     1/1999
(Continued)

*Primary Examiner* — Bijan Ahvazi
(74) *Attorney, Agent, or Firm* — Canon U.S.A. Inc., IP Division

(57) ABSTRACT

A compound having a bisazo moiety and a polyester moiety is provided. The compound can be provided as a pigment dispersant to improve the dispersion of an azo pigment in a water-insoluble solvent.

11 Claims, 2 Drawing Sheets

(51) Int. Cl.
  *C09B 67/46*   (2006.01)
  *G03F 7/00*    (2006.01)
  *C09D 17/00*   (2006.01)
  *G02B 1/04*    (2006.01)
  *G03F 7/105*   (2006.01)
  *C08K 5/23*    (2006.01)
  *C08G 63/00*   (2006.01)
  *G02B 5/22*    (2006.01)

(56) References Cited

FOREIGN PATENT DOCUMENTS

| | | |
|---|---|---|
| WO | 99-42532 A1    | 8/1999 |
| WO | 02/44283 A2    | 6/2002 |
| WO | 2005/056692 A2 | 6/2005 |
| WO | 2007/006637 A2 | 1/2007 |
| WO | 2011/098355 A1 | 8/2011 |
| WO | 2012/026504 A1 | 3/2012 |
| WO | 2012/032717 A1 | 3/2012 |

COMPOUND HAVING BISAZO DYE SKELETON, PIGMENT COMPOSITION CONTAINING THE SAME, PIGMENT DISPERSION, INK, AND COLOR FILTER RESIST COMPOSITION

TECHNICAL FIELD

The present invention relates to a novel compound having a bisazo dye skeleton bonded to a polyester resin, a pigment dispersant containing the compound, a pigment composition, and a pigment dispersion. The present invention also relates to an ink and a color filter resist composition, each containing the pigment dispersion as a colorant.

BACKGROUND ART

A reduction in the size of pigment particles so as to improve its spectral characteristics, such as tinting strength and transparency, results in an increase in the growth or transformation of crystals caused by thermal history or contact with a solvent in a dispersion process and subsequent processes, resulting in a decrease in the tinting strength and transparency of the pigment.

Various pigment compositions and pigment dispersants have been proposed in order to improve the dispersibility of pigments. PTL 1 discloses the use of a comb polymer dispersant having an acidic or basic portion known as Solsperse (registered trademark). PTL 2 discloses the use of a polymer dispersant for an azo pigment in an ink jet recording method. The polymer dispersant is a water-soluble polymer having a chromophore bonded to its side chain or end. The chromophore has a molecular weight of less than 95% of the molecular weight of the azo pigment.

PTL 3 discloses the use of a mixture of at least two organic pigments in red (R), green (G), and blue (B) color filters in order to achieve desired color characteristics. Particularly in the case of the green color filter, a main pigment, a copper phthalocyanine green pigment, is combined with an azo yellow pigment for tone adjustment.

However, the pigment dispersant described in PTL 1 cannot sufficiently disperse an azo pigment because of insufficient affinity for the azo pigment. The pigment dispersant described in PTL 2 is a water-soluble polymer and therefore results in poor dispersion in a system using a water-insoluble solvent as a dispersion medium.

There has been a problem that the use of an azo pigment in a color filter resist results in poor and unstable pigment dispersion and consequently poor color characteristics of the color filter.

CITATION LIST

Patent Literature

PTL 1 International Publication WO 99-42532
PTL 2 U.S. Pat. No. 7,582,152
PTL 3 Japanese Patent Laid-Open No. 11-14825

SUMMARY OF INVENTION

The present invention provides a pigment composition that has a high affinity for an azo pigment and can be satisfactorily dispersed in a water-insoluble solvent. The present invention also provides a pigment dispersion that has satisfactory dispersibility in a water-insoluble solvent. The present invention also provides an ink and a color filter resist composition, each containing the pigment dispersion and thereby having excellent pigment dispersibility and color characteristics.

The present invention relates to a compound having a polyester moiety and a bisazo structure moiety having the following formula (1) or (2):

[Chem. 1]

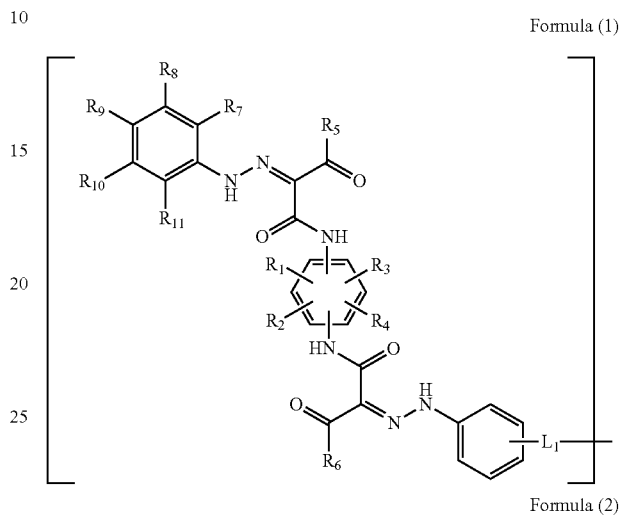

Formula (1)

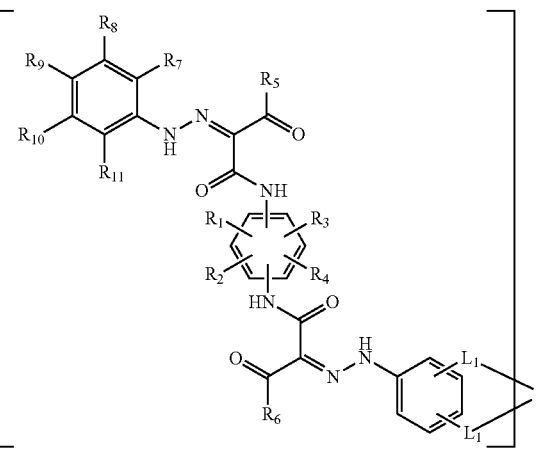

Formula (2)

wherein $R_1$ to $R_4$ independently denote a hydrogen atom or a halogen atom, $R_5$ and $R_6$ independently denote an alkyl group having 1 to 6 carbon atoms or a phenyl group, $R_7$ to $R_{11}$ independently denote a hydrogen atom, a $COOR_{12}$ group, or a $CONR_{13}R_{14}$ group, provided that at least one of $R_7$ to $R_{11}$ denotes the $COOR_{12}$ group or the $CONR_{13}R_{14}$ group, $R_{12}$ to $R_{14}$ independently denote a hydrogen atom or an alkyl group having 1 to 3 carbon atoms, and $L_1$ denotes a divalent linking group to be bonded to the polyester moiety.

The present invention also relates to a pigment composition and a pigment dispersion each containing the compound. The present invention also relates to an ink and a color filter resist composition, each containing the pigment dispersion as a colorant.

Further features of the present invention will become apparent from the following description of exemplary embodiments with reference to the attached drawings.

DESCRIPTION OF EMBODIMENTS

Figure 1:
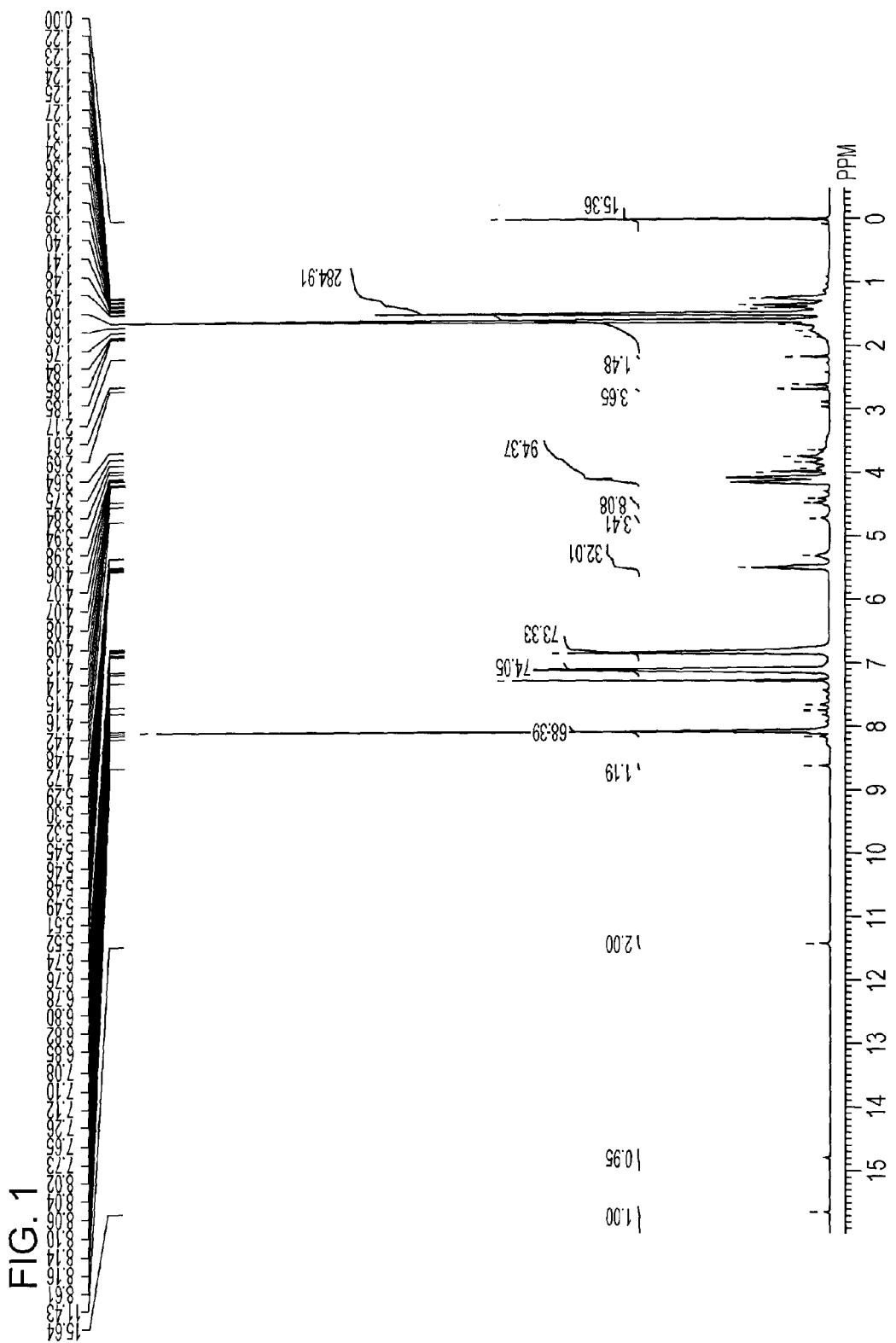
FIG. 1 is a $^1$H NMR spectrum of a polyester (35) having a bisazo dye skeleton measured at 400 MHz in CDCl$_3$ at room temperature.

The present invention will be described in detail in the following embodiments. A compound having a bisazo structure moiety represented by the formula (1) or (2) and a polyester moiety is hereinafter referred to as a "polyester having a bisazo dye skeleton". The polyester moiety refers to a polyester resin moiety other than the bisazo structure moiety in the compound.

A compound according to an embodiment of the present invention will be described below. A compound according to an embodiment of the present invention includes a bisazo structure moiety having the following formula (1) or (2), which has a high affinity for an azo pigment, and a polyester moiety having a high affinity for a water-insoluble solvent.

[Chem. 1]

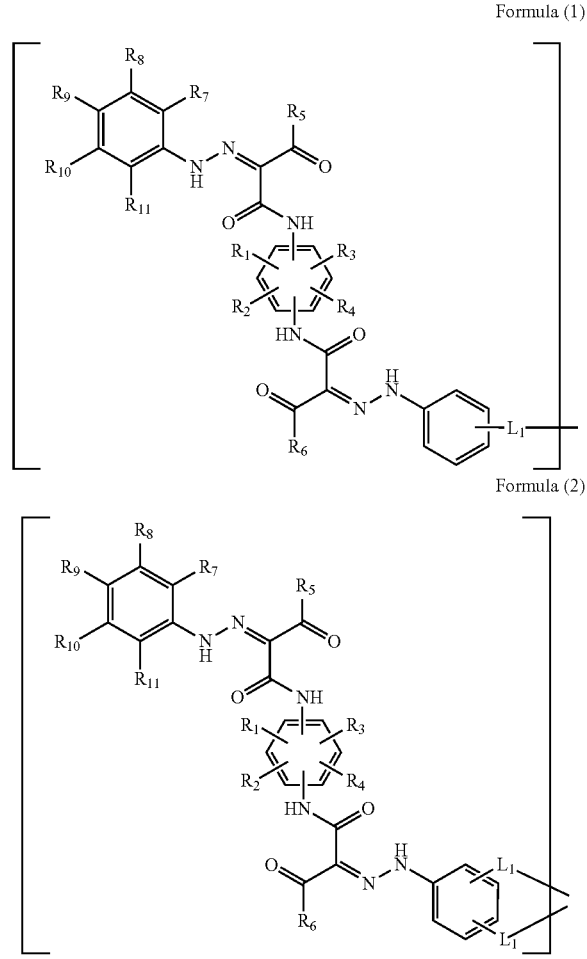

Formula (1)

Formula (2)

wherein $R_1$ to $R_4$ independently denote a hydrogen atom or a halogen atom, $R_5$ and $R_6$ independently denote an alkyl group having 1 to 6 carbon atoms or a phenyl group, $R_7$ to $R_{11}$ independently denote a hydrogen atom, a COOR$_{12}$ group, or a CONR$_{13}$R$_{14}$ group, provided that at least one of $R_7$ to $R_{11}$ denotes the COOR$_{12}$ group or the CONR$_{13}$R$_{14}$ group, $R_{12}$ to $R_{14}$ independently denote a hydrogen atom or an alkyl group having 1 to 3 carbon atoms, and $L_1$ denotes a divalent linking group to be bonded to the polyester moiety.

The functional groups in the bisazo structure moieties having the formulae (1) and (2) will be described below.

Examples of a halogen atom in $R_1$ to $R_4$ include, but are not limited to, a fluorine atom, a chlorine atom, a bromine atom, and an iodine atom. A hydrogen atom in $R_1$ to $R_4$ can contribute to a high affinity for a pigment.

The positions of $R_1$ to $R_4$ and two acylacetamide groups may be such that the acylacetamide groups are located at the o-, m-, or p-position to each other. The affinity for a pigment is almost independent of the substitution position. A compound having the acylacetamide groups in the p-position to each other can be easily manufactured. Examples of an alkyl group in $R_5$ and $R_6$ include, but are not limited to, linear, branched, and cyclic alkyl groups having 1 to 6 carbon atoms, such as a methyl group, an ethyl group, a n-propyl group, a n-butyl group, a n-pentyl group, a n-hexyl group, an isopropyl group, an isobutyl group, a sec-butyl group, a tert-butyl group, and a cyclohexyl group. A substituent in $R_5$ and $R_6$ may be further substituted by an additional substituent, provided that the additional substituent does not significantly lower the affinity for a pigment. Examples of the additional substituent include, but are not limited to, a halogen atom, a nitro group, an amino group, a hydroxy group, a cyano group, and a trifluoromethyl group.

$R_5$ and $R_6$ may be a methyl group in terms of affinity for a pigment.

$L_1$ in the formulae (1) and (2) denotes a divalent linking group for connecting the bisazo dye skeleton to the polyester.

The bisazo dye skeleton is connected to the polyester through one $L_1$ in the formula (1) or two $L_1$'s in the formula (2).

$L_1$ may be any divalent linking group. In terms of ease of manufacture, $L_1$ may be such that a linkage of the bisazo skeleton moiety and the polyester resin moiety forms a carboxylate bond, a carboxylic acid amide bond, or a sulfonate bond.

In terms of affinity for a pigment, $L_1$ may be located at a 4-position relative to the hydrazo group.

$R_7$ to $R_{11}$ denotes a hydrogen atom, a COOR$_{12}$ group, or a CONR$_{13}$R$_{14}$ group, provided that at least one of $R_7$ to $R_{11}$ denotes the COOR$_{12}$ group or the CONR$_{13}$R$_{14}$ group. In terms of affinity for an azo pigment, $R_7$ and $R_{10}$ denote a COOR$_{12}$ group, and $R_8$, $R_9$, and $R_{11}$ denote a hydrogen atom.

Examples of an alkyl group in $R_{12}$ to $R_{14}$ include, but are not limited to, a methyl group, an ethyl group, a n-propyl group, and an isopropyl group.

$R_{12}$ in a COOR$_{12}$ group may be a methyl group, $R_{13}$ in a CONR$_{13}$R$_{14}$ group may be a methyl group, and $R_{14}$ in a CONR$_{13}$R$_{14}$ group may be a methyl group or a hydrogen atom.

A bisazo dye skeleton moiety having the following formula (7) can contribute to a high affinity for a pigment.

[Chem. 2]

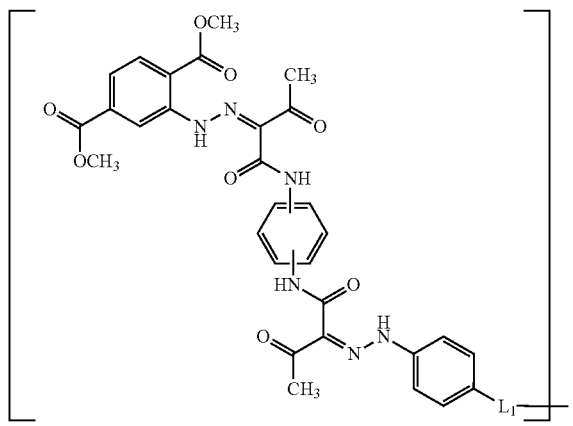

Formula (7)

The polyester moiety will be described below.

The polyester moiety may have a linear, branched, or crosslinked structure.

In terms of affinity for a water-insoluble solvent, the polyester moiety may be a polycondensation polymer of a dicarboxylic acid and a diol or a hydroxy acid polycondensation polymer.

The dicarboxylic acid constituting the polyester moiety may have an alkylene group, an alkenylene group, or an arylene group. Examples of the alkylene group include, but are not limited to, linear, branched, and cyclic alkylene groups, such as a methylene group, an ethylene group, a trimethylene group, a propylene group, a tetramethylene group, a hexamethylene group, a neopentylene group, a heptamethylene group, an octamethylene group, a nonamethylene group, a decamethylene group, an undecamethylene group, a dodecamethylene group, a 1,3-cyclopentylene group, a 1,3-cyclohexylene group, and a 1,4-cyclohexylene group. Examples of the alkenylene group include, but are not limited to, a vinylene group, a propenylene group, and a 2-butenylene group. Examples of the arylene group include, but are not limited to, a 1,4-phenylene group, a 1,3-phenylene group, a 1,2-phenylene group, a 2,6-naphthylene group, a 2,7-naphthylene group, and a 4,4'-biphenylene group.

These alkylene group, alkenylene group, and arylene group may be substituted by a substituent, provided that the affinity for a water-insoluble solvent is not significantly lowered. Examples of the substituent include, but are not limited to, a methyl group, halogen atoms, a carboxy group, a trifluoromethyl group, and combinations thereof.

In terms of affinity for a nonpolar solvent, the alkylene group, the alkenylene group, and the arylene group may be an alkylene group having six or more carbon atoms or a phenylene group each having a carboxy group at both ends.

In terms of affinity for a water-insoluble solvent, a diol monomer for constituting the polyester moiety may have an alkylene group or a phenylene group each having a hydroxy group at both ends. The diol monomer for constituting the polyester moiety may be an ethylene oxide additive of bisphenol A or a propylene oxide adduct of bisphenol A. The additive number of ethylene oxides or propylene oxides may be in the range of 2 to 10. Examples of the alkylene group include, but are not limited to, linear, branched, and cyclic alkylene groups, such as a methylene group, an ethylene group, a trimethylene group, a propylene group, a tetramethylene group, a hexamethylene group, a neopentylene group, a heptamethylene group, an octamethylene group, a nonamethylene group, a decamethylene group, an undecamethylene group, a dodecamethylene group, a 1,3-cyclopentylene group, a 1,3-cyclohexylene group, and a 1,4-cyclohexylene group. The alkylene group may be an alkylene group having six or more carbon atoms.

Examples of the phenylene group include, but are not limited to, a 1,4-phenylene group, a 1,3-phenylene group, and a 1,2-phenylene group.

The alkylene group or the phenylene group may be further substituted by a substituent, provided that the affinity for a water-insoluble solvent is not significantly lowered. Examples of the substituent include, but are not limited to, a methyl group, alkoxy groups, a hydroxy group, halogen atoms, and combinations thereof.

A hydroxy acid monomer for constituting the polyester moiety may have an alkylene group or an alkenylene group each having a hydroxy group or a carboxy group at both ends.

Examples of the alkylene group include, but are not limited to, linear, branched, and cyclic alkylene groups, such as a methylene group, an ethylene group, a trimethylene group, a propylene group, a tetramethylene group, a hexamethylene group, a neopentylene group, a heptamethylene group, an octamethylene group, a nonamethylene group, a decamethylene group, an undecamethylene group, a dodecamethylene group, and a 1,4-cyclohexylene group.

Examples of the alkenylene group include, but are not limited to, a vinylene group, a propenylene group, a butenylene group, a butadienylene group, a pentenylene group, a hexenylene group, a hexadienylene group, a heptenylene group, an octanylene group, a decenylene group, an octadecenylene group, an eicosenylene group, and a triacontenylene group. These alkenylene groups may have a linear, branched, or cyclic structure. The alkenylene group may have at least one double bond at any position.

The alkylene group or the alkenylene group may be further substituted by a substituent, provided that the affinity for a water-insoluble solvent is not significantly lowered. Examples of the substituent include, but are not limited to, alkyl groups, alkoxy groups, a hydroxy group, halogen atoms, and combinations thereof.

In terms of affinity for a nonpolar solvent, the alkylene group or the alkenylene group may be an alkylene group or an alkenylene group each having six or more carbon atoms.

In order to improve pigment dispersibility, the polyester having a bisazo dye skeleton may have a number-average molecular weight (Mn) of 500 or more. Although the polyester having a higher molecular weight can more improve pigment dispersibility, an excessively high molecular weight unfavorably results in a low affinity for a water-insoluble solvent. The polyester resin may therefore have a number-average molecular weight (Mn) of 200,000 or less. In consideration of the ease of manufacture, the polyester having a bisazo dye skeleton may have a number-average molecular weight in the range of 2000 to 20000.

The bisazo structure moiety having the formula (1) has tautomers having the following formulae (9) and (10). These tautomers are also within the scope of the present invention.

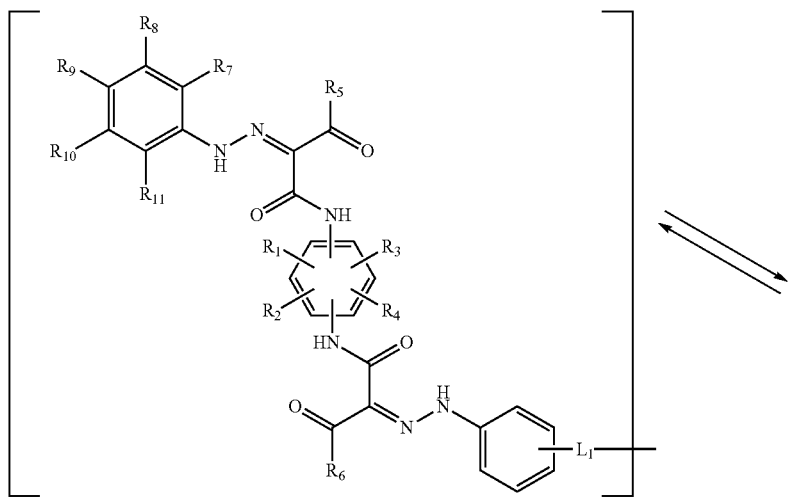
Formula (1)
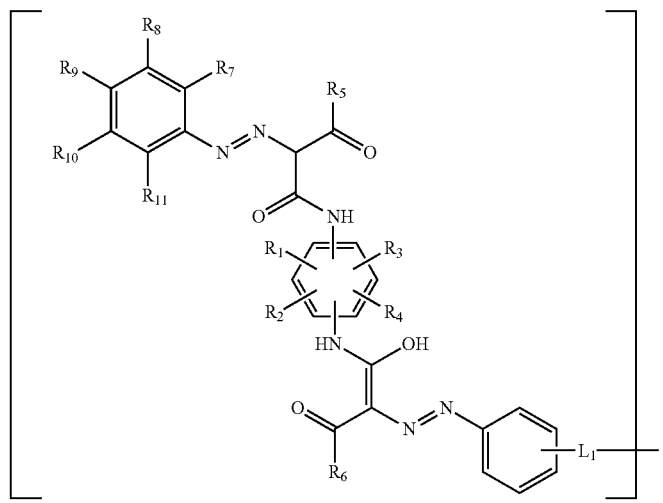
Formula (9)
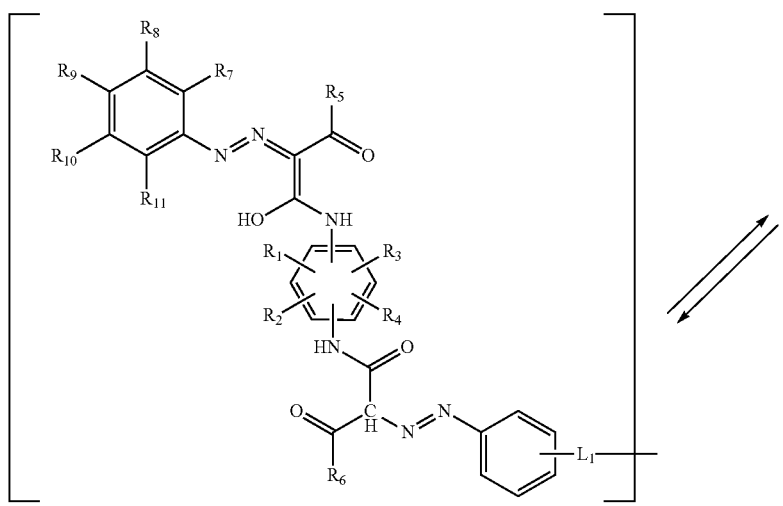
Formula (10)

In the formulae (9) and (10), $L_1$ and $R_1$ to $R_{11}$ are the same as $L_1$ and $R_1$ to $R_{11}$ in the formula (1).
The bisazo structure moiety having the formula (2) has tautomers having the following formulae (11) and (12). These tautomers are also within the scope of the present invention.
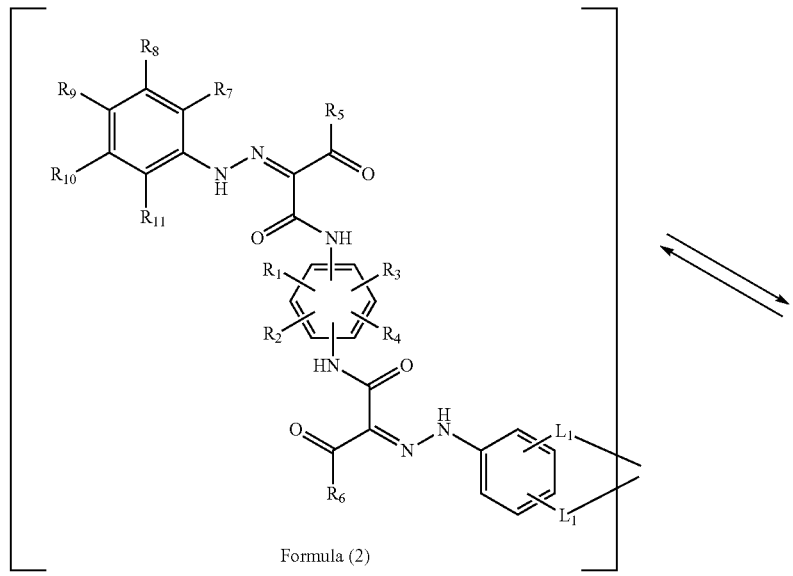
Formula (2)
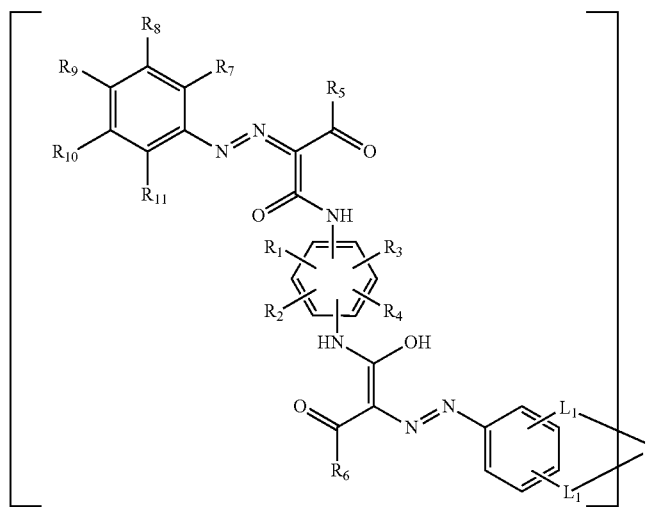
Formula (11)

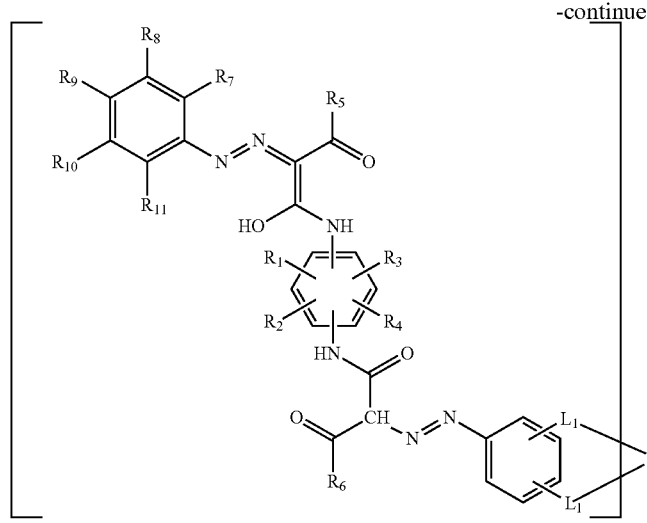
Formula (12)
In the formulae (11) and (12), $L_1$ and $R_1$ to $R_{11}$ are the same as $L_1$ and $R_1$ to $R_{11}$ in the formula (2).
The bisazo structure moiety having the formula (1) or (2) can be synthesized by a known method. The following is an example of a synthesis scheme up to the production of an azo dye intermediate (20).
[Chem. 5]
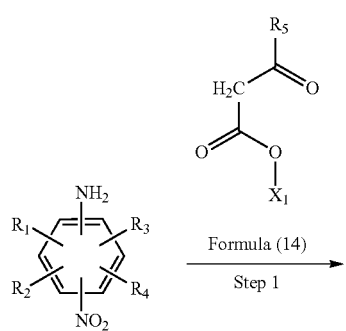
Formula (13)
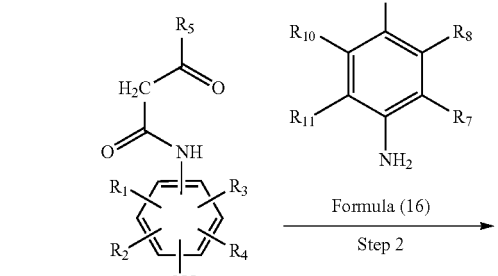
Formula (15)
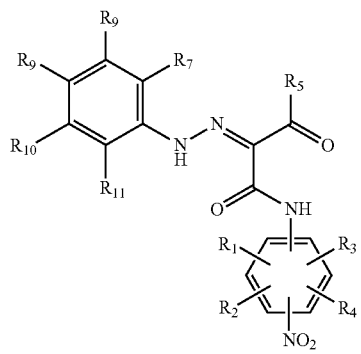
Formula (17)
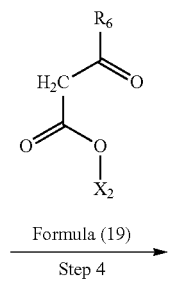
Formula (18)

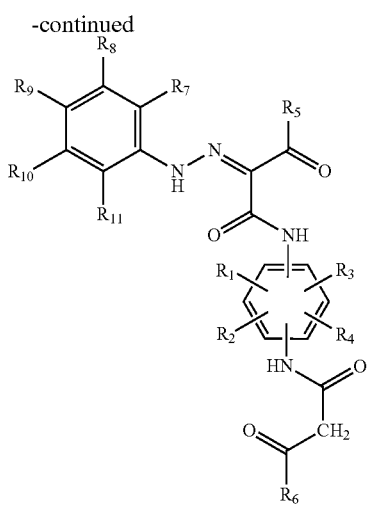

Formula (20)

$R_1$ to $R_{11}$ in the formulae (13) to (20) are the same as in the formula (1) or (2). $X_1$ and $X_2$ are leaving groups.

This scheme includes a step 1 of amidation between a nitroaniline derivative having the formula (13) and an acetoacetic acid analog having the formula (14) to synthesize an intermediate (15), which is an acetoacetanilide analog, a step 2 of diazocoupling between the intermediate (15) and an aniline derivative (16) to synthesize an azo compound (17), a step 3 of reducing a nitro group of the azo compound (17) to synthesize an intermediate (18), which is an aniline analog, and a step 4 of amidation between the intermediate (18) and an acetoacetic acid analog having the formula (19) to synthesize an azo dye intermediate (20).

The step 1 will be described below. A known method may be used in the step 1 (for example, Datta E. Ponde, et al., "The Journal of Organic Chemistry", (the U.S.A.), American Chemical Society, 1998, vol. 63, No. 4, pp. 1058-1063). In the case that $R_5$ in the formula (15) is a methyl group, the acetoacetic acid analog (14) may be replaced with diketene (for example, Kiran Kumar Solingapuram Sai, et al., "The Journal of Organic Chemistry", (the U.S.A.), American Chemical Society, 2007, vol. 72, No. 25, pp. 9761-9764).

The nitroaniline derivative (13) and the acetoacetic acid analog (14) may be commercially available or may be synthesized by a known method.

The step 1 may be performed in the absence of a solvent or in the presence of a solvent in order to prevent rapid progress of the reaction. The solvent may be any solvent that does not inhibit the reaction. Examples of the solvent include, but are not limited to, alcohols, such as methanol, ethanol, and propanol; esters, such as methyl acetate, ethyl acetate, and propyl acetate; ethers, such as diethyl ether, tetrahydrofuran, and dioxane; hydrocarbons, such as benzene, toluene, xylene, hexane, and heptane; halogen-containing hydrocarbons, such as dichloromethane, dichloroethane, and chloroform; amides, such as N,N-dimethylformamide and N,N-dimethylimidazolidinone; nitriles, such as acetonitrile and propionitrile; acids, such as formic acid, acetic acid, and propionic acid; and water. These solvents may be used alone or in combination. The mixing ratio of solvents may be determined in accordance with the solubility of the solute. The amount of solvent to be used may be appropriately determined and, in terms of reaction rate, may be 1.0 to 20 times the mass of the compound having the formula (13).

The step 1 is generally performed at a temperature in the range of 0° C. to 250° C. and is generally completed within 24 hours.

The step 2 will be described below. A known method can be used in the step 2. More specifically, for example, the following method can be used. First, the aniline derivative (16) is allowed to react with a diazotizing agent, such as sodium nitrite or nitrosylsulfuric acid, in the presence of an inorganic acid, such as hydrochloric acid or sulfuric acid, in a methanol solvent to synthesize a corresponding diazonium salt. The diazonium salt is coupled with the intermediate (15) to synthesize the azo compound (17).

The aniline derivative (16) may be commercially available or may be synthesized by a known method.

The step 2 may be performed in the absence of a solvent or in the presence of a solvent in order to prevent rapid progress of the reaction. The solvent may be one of those described for the step 1. The amount of solvent to be used may be appropriately determined and, in terms of reaction rate, may be 1.0 to 20 times the mass of the compound having the formula (16).

The step 2 is generally performed at a temperature in the range of −50° C. to 100° C. and is generally completed within 24 hours.

The step 3 will be described below. A known method can be used in the step 3. For example, a method using a metallic compound can be found in "Jikken Kagaku Koza (lecture on experimental chemistry)", Maruzen Co., Ltd., first edition, vol. 17-2, pp. 162-179. A catalytic hydrogenation method can be found in "Jikken Kagaku Koza (lecture on experimental chemistry)", Maruzen Co., Ltd., first edition, vol. 15, pp. 390-448 or International Publication WO 2009-060886.

The step 3 may be performed in the absence of a solvent or in the presence of a solvent in order to prevent rapid progress of the reaction. The solvent may be one of those described for the step 1. The amount of solvent to be used may be appropriately determined in accordance with the solubility of the solute and, in terms of reaction rate, may be 1.0 to 20 times the mass of the compound having the formula (17). The step 3 is generally performed at a temperature in the range of 0° C. to 250° C. and is generally completed within 24 hours.

The step 4 will be described below. In the step 4, the azo dye intermediate (20) is synthesized by the method described in the step 1.

The polyester having the bisazo dye skeleton represented by the formula (1) or (2) may be produced from the azo dye intermediate (20) by the following methods (i) to (iii).

The method (i) will be described in detail below.

Method (i)

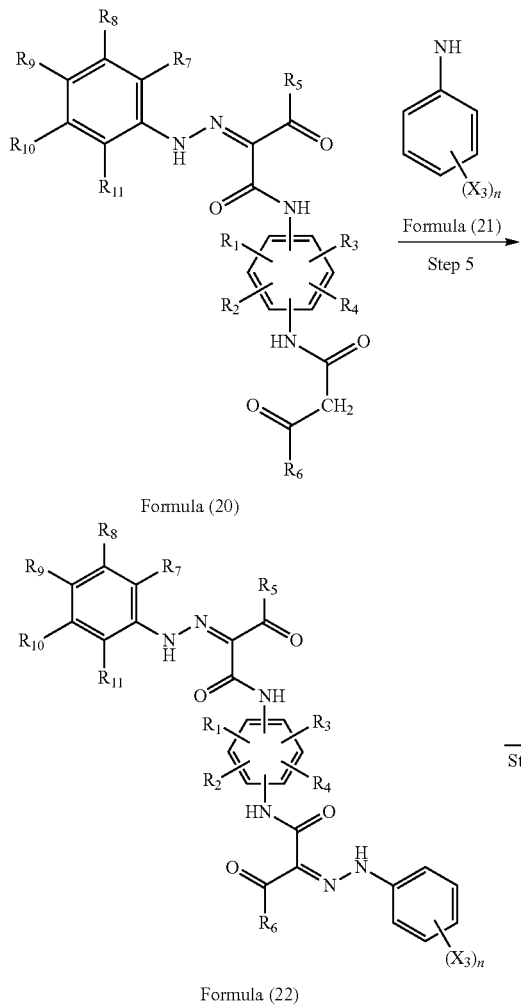

Formula (20)

Formula (22)

Polyester having bis-azo dye skeleton represented by formula (1) or (2)

In the formulae (20) to (22), $R_1$ to $R_{11}$ are the same as $R_1$ to $R_{11}$ in the formula (1) or (2). n is an integer of 1 or 2. $X_3$ denotes a substituent that can react to form a linking group $L_1$ in the formula (1) or (2). $P_1$ denotes a polyester resin.

The scheme described above includes a step 5 of diazocoupling between the azo dye intermediate (20) and an aniline derivative (21) to synthesize a bisazo compound (22) and a step 6 of esterification or amidation between the bisazo compound (22) and the polyester resin $P_1$ synthesized in advance to synthesize a polyester having the bisazo dye skeleton represented by the formula (1) or (2).

First, the step 5 will be described below. In the step 5, the bisazo compound (22) can be synthesized by the method described in the step 2.

The aniline derivative (21) may be commercially available or may be synthesized by a known method.

The step 6 will be described below. A known method can be used in the step 6. More specifically, for example, a polyester having the bisazo dye skeleton represented by the formula (1) or (2) in which the linking group $L_1$ is a carboxylate group may be synthesized using a polyester resin $P_1$ having a carboxy group and the aniline derivative (21) in which $X_3$ has a hydroxy group. A polyester having the bisazo dye skeleton represented by the formula (1) or (2) in which the linking group $L_1$ is a sulfonate group may be synthesized using a polyester resin $P_1$ having a hydroxy group and the aniline derivative (21) in which $X_3$ has a sulfo group. A polyester having the bisazo dye skeleton represented by the formula (1) or (2) in which the linking group $L_1$ is a carboxylic acid amide group may be synthesized using a polyester resin $P_1$ having a carboxy group and the aniline derivative (21) in which $X_3$ has an amino group. Specific examples of the known method include, but are not limited to, a method using a dehydrating and condensing agent, for example, 1-ethyl-3-(3-dimethylaminopropyl)carbodiimide hydrochloride (for example, Melvin S. Newman, et al., "Journal of Organic Chemistry", (the U.S.A.), American Chemical Society, 1961, vol. 26, No. 7, pp. 2525-2528) and a Schotten-Baumann method (for example, Norman O. V. Sonntag, "Chemical Reviews", (the U.S.A.), American Chemical Society, 1953, vol. 52, No. 2, pp. 237-416).

The step 6 may be performed in the absence of a solvent or in the presence of a solvent in order to prevent rapid progress of the reaction. The solvent may be any solvent that does not inhibit the reaction. Examples of the solvent include, but are not limited to, ethers, such as diethyl ether, tetrahydrofuran, and dioxane; hydrocarbons, such as benzene, toluene, xylene, hexane, and heptane; halogen-containing hydrocarbons, such as dichloromethane, dichloroethane, and chloroform; amides, such as N,N-dimethylformamide and N,N-dimethylimidazolidinone; and nitriles, such as acetonitrile and propionitrile. These solvents may be used alone or in combination. The mixing ratio of solvents may be determined in accordance with the solubility of the solute. The amount of solvent to be used may be appropriately determined and, in terms of reaction rate, may be 1.0 to 20 times the mass of the compound having the formula (21).

The step 6 is generally performed at a temperature in the range of 0° C. to 250° C. and is generally completed within 24 hours.

The method (ii) will be described in detail below.

Method (ii)

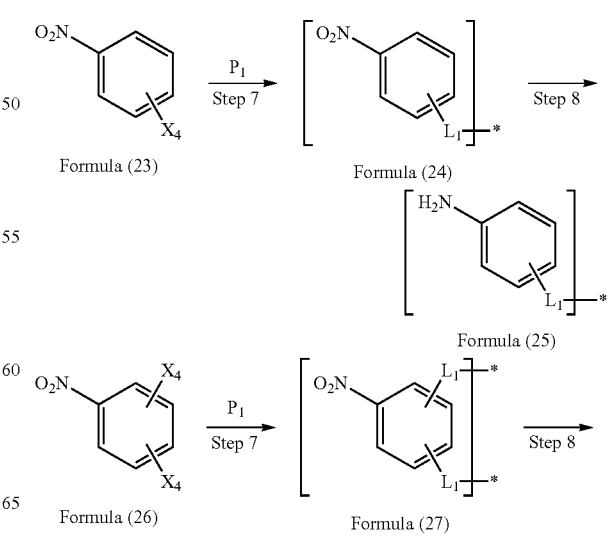

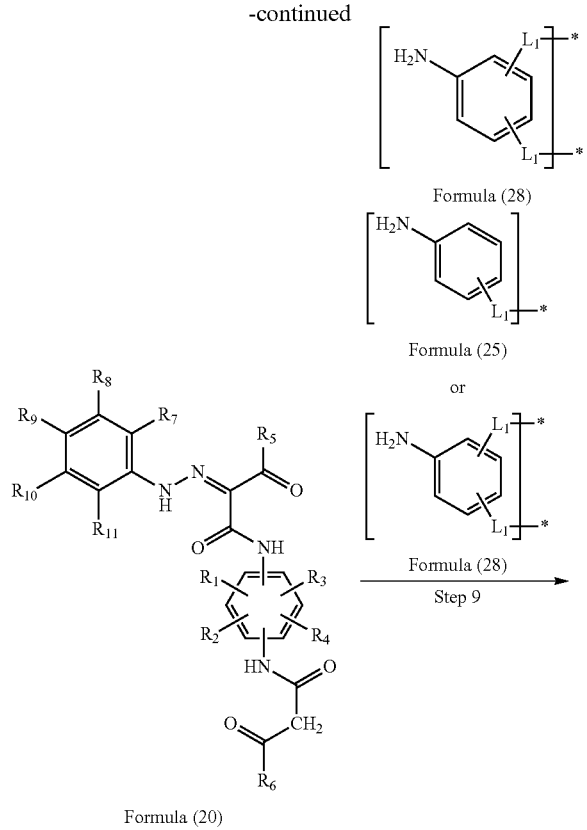

Formula (28)

Formula (25)

or

Formula (28)

Step 9

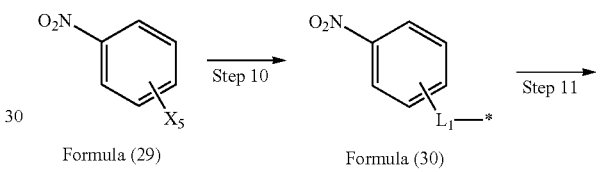

Formula (20)

Polyester having bis-azo dye skeleton represented by formula (1) or (2)

of the reaction. The solvent may be one of those described for the method (i). The amount of solvent to be used may be appropriately determined and, in terms of reaction rate, may be 1.0 to 20 times the mass of the compound having the formula (23) or (26).

The step 7 is generally performed at a temperature in the range of 0° C. to 250° C. and is generally completed within 24 hours.

The raw materials (23) and (26) may be commercially available or may be synthesized by a known method.

The step 8 will be described below. In the step 8, the intermediate (25) or (28) can be synthesized by the method described in the step 3.

The step 9 will be described below. In the step 9, a polyester having the bisazo dye skeleton represented by the formula (1) or (2) can be synthesized by the method described in the step 2.

The method (iii) will be described in detail below.

Method (iii)

[Chem. 8]

Formula (29)   Step 10   Formula (30)   Step 11

In the formulae (20) and (23) to (28), $L_1$ and $R_1$ to $R_{11}$ are the same as $L_1$ and $R_1$ to $R_{11}$ in the formula (1) or (2). $X_4$ denotes a substituent that can react to form a linking group $L_1$ in the formula (1) or (2). $P_1$ denotes a polyester resin. "*" denotes a linkage between the linking group $L_1$ and the polyester resin.

This scheme includes a step 7 of esterification or amidation between the raw material (23) or (26) and the polyester resin $P_1$ synthesized in advance to synthesize an intermediate (24) or (27), a step 8 of reducing a nitro group in the intermediate (24) or (27) to synthesize an aniline analog intermediate (25) or (28), and a step 9 of diazocoupling between the azo dye intermediate (20) and the aniline analog (25) or (28) to synthesize a polyester having the bisazo dye skeleton represented by the formula (1) or (2).

First, the step 7 will be described below. A known method can be used in the step 7. More specifically, for example, the intermediate (24) or (27) in which the linking group $L_1$ is a carboxylate group can be synthesized using the polyester resin $P_1$ having a hydroxy group and the raw material (23) or (26) in which $X_4$ has a carboxylic acid halide group. The intermediate (24) or (27) in which the linking group $L_1$ is a sulfonate group can be synthesized using the polyester resin $P_1$ having a hydroxy group and the raw material (23) or (26) in which $X_4$ has a sulfonic acid halide group. Specific examples of the known method include, but are not limited to, the Schotten-Baumann method (for example, Norman O. V. Sonntag, "Chemical Reviews", (the U.S.A.), American Chemical Society, 1953, vol. 52, No. 2, pp. 237-416).

The step 7 may be performed in the absence of a solvent or in the presence of a solvent in order to prevent rapid progress

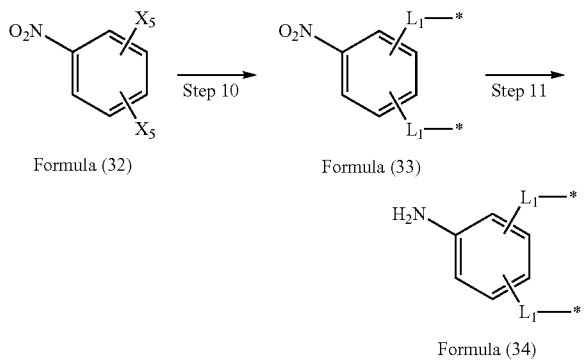

Formula (31)

Formula (32)   Step 10   Formula (33)   Step 11

Formula (34)

-continued

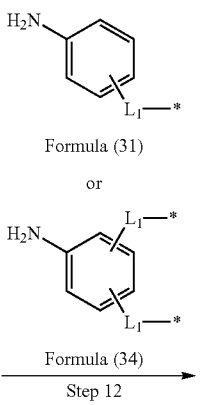

Formula (31)

or

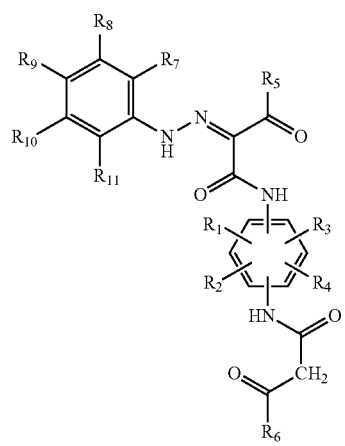

Formula (20)

Formula (34)

Step 12

→ Polyester having bis-azo dye skeleton represented by formula (1) or (2)

In the formulae (20) and (29) to (34), $L_1$ and $R_1$ to $R_{11}$ are the same as $L_1$ and $R_1$ to $R_{11}$ in the formula (1) or (2). $X_5$ denotes a substituent that can react to form a linking group $L_1$ in the formula (1) or (2). "*" denotes a linkage between the linking group $L_1$ and the polyester resin.

This scheme includes a step 10 of polycondensation or ring-opening polymerization of a monomer for the polyester resin using a raw material (29) or (32) as a polymerization initiator to synthesize an intermediate (30) or (33), a step 11 of reducing a nitro group in the intermediate (30) or (33) to synthesize an aniline analog intermediate (31) or (34), and a step 12 of diazocoupling between the azo dye intermediate (20) and the aniline analog (31) or (34) to synthesize a polyester having the bisazo dye skeleton represented by the formula (1) or (2).

First, the step 10 will be described below. In the step 10, the intermediate (30) or (33) can be synthesized by the addition of the raw material (29) or (32) as a polymerization initiator in polycondensation or ring-opening polymerization of a hydroxycarboxylic acid or lactone.

The step 10 may be performed in the absence of a solvent or in the presence of a solvent in order to prevent rapid progress of the reaction. The solvent may be one of those described for the method (i). The amount of solvent to be used may be appropriately determined and, in terms of reaction rate, may be 1.0 to 20 times the mass of the raw material (29) or (32).

The step 10 is generally performed at a temperature in the range of 0° C. to 250° C. and is generally completed within 24 hours.

In the raw materials (29) and (32), the substituent $X_5$ may have a carboxy group or a hydroxy group.

The raw materials (29) and (32) are commercially available. Examples of the raw materials (29) and (32) include, but are not limited to, 2-nitrophenol, 3-nitrophenol, 4-nitrophenol, 4-nitrocatechol, 2-nitrobenzyl alcohol, 3-nitrobenzyl alcohol, 4-nitrobenzyl alcohol, 4-nitrophenethyl alcohol, 2-nitrobenzoic acid, 3-nitrobenzoic acid, 4-nitrobenzoic acid, 4-nitrophthalic acid, 5-nitroisophthalic acid, and 4-nitrophenylacetic acid.

The molecular weight of the polyester resin can be desirably controlled in accordance with the quantitative ratio of the raw material (29) or (32) to the monomer for the polyester resin.

The step 11 will be described below. In the step 11, the aniline analog (31) or (34) can be synthesized by the method described in the step 3.

The step 12 will be described below. In the step 12, a polyester having the bisazo dye skeleton represented by the formula (1) or (2) can be synthesized by the method described in the step 2.

Common isolation and purification methods for organic compounds may be used for the compounds having the formula (1), (2), (15), (17), (18), (20), (22), (24), (25), (27), (28), (30), (31), (33), and (34). Examples of such isolation and purification methods include, but are not limited to, recrystallization methods and reprecipitation methods using organic solvents and column chromatography using silica gel. These methods may be used alone or in combination to achieve high purity.

The compounds having the formulae (15), (17), (18), (20) and (22) produced through these steps were identified and quantified by nuclear magnetic resonance spectroscopy [ECA-400, manufactured by JEOL Ltd.], ESI-TOF MS (LC/MSD TOF, manufactured by Agilent Technologies), and HPLC analysis [LC-20A, manufactured by Shimadzu Corp.].

The compounds having the formulae (1), (2), (24), (25), (27), (28), (30), (31), (33), and (34) produced through these steps were identified and quantified by high performance GPC [HLC8220GPC, manufactured by Tosoh Corp.], nuclear magnetic resonance spectroscopy [ECA-400, manufactured by JEOL Ltd.], and acid value measurement according to JIS K-0070 [automatic titrator COM-2500, manufactured by Hiranuma Sangyo Co., Ltd.].

A method for producing the polyester resin $P_1$ (polyester moiety) will be described below. The method for producing the polyester resin is not particularly limited and may be a known method. For example, $P_1$ can be produced by polycondensation between a dicarboxylic acid and a diol in a solvent in an inert gas atmosphere.

The polymerization reaction may be promoted with a catalyst. Examples of the catalyst include, but are not limited to, metal catalysts, such as antimony trioxide, di-n-butyltin oxide, tin(II) oxalate, tin di(2-ethylhexanoate), germanium oxide, germanium tetraethoxide, germanium tetrabutoxide, titanium tetraisopropoxide, titanium tetrabutoxide, manganese acetate, zinc di(2-ethylhexanoate), and zinc acetate. The amount of catalyst to be added may be in the range of 0.001% to 0.5% by mole of the polyester.

The solvent for use in the polymerization reaction may be separated from water produced by the polymerization reaction. Examples of the solvent include, but are not limited to, toluene, xylene, mesitylene, 1,2,3,5-tetramethylbenzene, chlorobenzene, 1,2-dichlorobenzene, 1,3-dichlorobenzene, bromobenzene, 1,2-dibromobenzene, 1,3-dibromobenzene, iodobenzene, 1,2-diiodobenzene, diphenyl ether, and dibenzyl ether. These solvents may be used alone or in combination. The mixing ratio of solvents may be appropriately determined.

In order to increase the reaction rate and the degree of polymerization of the polyester resin, the solvent used in the polymerization reaction is refluxed to remove by-products, such as water and alcohol. The polymerization reaction can therefore be performed at approximately the reflux temperature of the solvent.

In the self-condensation-type polymerization reaction, the addition of a monocarboxylic acid or a monoalcohol to the reaction system to esterify an unreacted hydroxy or carboxy group can improve the molecular weight control of the polyester resin and pigment dispersion as a dispersant.

Examples of a monocarboxylic acid that can be used as a reaction inhibitor for a terminal hydroxy group of the polyester resin include, but are not limited to, monovalent carboxylic acids, such as acetic acid, butyric acid, valeric acid, caproic acid, heptanoic acid, caprylic acid, lauric acid, stearic acid, oleic acid, benzoic acid, p-toluic acid, dimethylbenzoic acid, ethylbenzoic acid, cumic acid, and 2,3,4,5-tetramethylbenzoic acid. The monocarboxylic acid may be a branched aliphatic carboxylic acid so as to improve pigment dispersibility.

Examples of a monoalcohol that can be used as a reaction inhibitor for a terminal carboxy group of the polyester resin include, but are not limited to, monohydric alcohols, such as methanol, ethanol, n-propyl alcohol, isopropyl alcohol, n-amyl alcohol, 2-ethylhexyl alcohol, and lauryl alcohol. The monoalcohol may be a branched aliphatic alcohol so as to improve pigment dispersibility.

The addition of a tri- or higher-valent carboxylic acid or alcohol to the reaction system in the polymerization reaction to synthesize a cross-linked polyester polycondensation polymer can improve the affinity for a dispersion medium.

Examples of the tri- or higher-valent carboxylic acid include, but are not limited to, 1,2,4-benzenetricarboxylic acid (trimellitic acid), 1,3,5-benzenetricarboxylic acid, 2,5,7-naphthalenetricarboxylic acid, 1,2,4-naphthalenetricarboxylic acid, 1,2,4-butanetricarboxylic acid, 1,2,5-hexanetricarboxylic acid, 1,3-dicarboxylic-2-methyl-2-methylenecarboxypropane, 1,2,4-cyclohexanetricarboxylic acid, 1,2,7,8-octanetetracarboxylic acid, pyromellitic acid, and acid anhydrides and lower alkyl esters thereof.

Examples of the tri- or higher-valent alcohol include, but are not limited to, sorbitol, 1,2,3,6-hexanetetrol, 1,4-sorbitan, pentaerythritol, dipentaerythritol, tripentaerythritol, 1,2,4-butanetriol, 1,2,5-pentanetriol, glycerin, 2-methylpropanetriol, 2-methyl-1,2,4-butanetriol, trimethylolethane, trimethylolpropane, and 1,3,5-trihydroxymethylbenzene.

A polyester having a bisazo dye skeleton according to an embodiment of the present invention has a high affinity for an azo pigment and can be suitably used as a pigment dispersant.

A pigment composition according to an embodiment of the present invention will be described below. A pigment composition according to an embodiment of the present invention contains a compound according to an embodiment of the present invention and an azo pigment. A compound according to an embodiment of the present invention has a high affinity for an azo pigment, particularly an acetoacetanilide pigment, and a water-insoluble solvent.

A pigment composition according to an embodiment of the present invention can be used in paints, inks, and resin molded products. Examples of pigments for use in the present invention include, but are not limited to, monoazo pigments, bisazo pigments, and polyazo pigments.

Among others, the polyester having a bisazo dye skeleton has a high affinity for acetoacetanilide pigments, such as C.I. Pigment Yellow 74, C.I. Pigment Yellow 93, C.I. Pigment Yellow 128, C.I. Pigment Yellow 155, C.I. Pigment Yellow 175, and C.I. Pigment Yellow 180. In particular, C.I. Pigment Yellow 155 having the following formula (8) can be well dispersed with the polyester having a bisazo dye skeleton. These pigments may be used alone or in combination.

[Chem. 9]

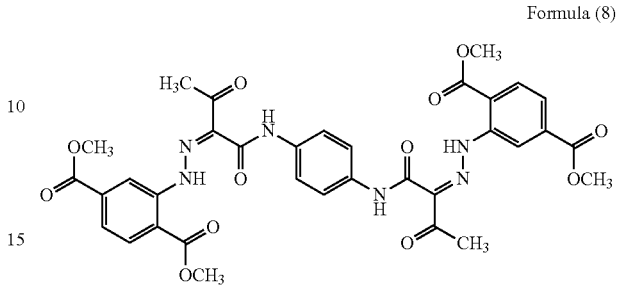

Formula (8)

In addition to the pigments described above, any pigment for which the polyester having a bisazo dye skeleton has a high affinity may be suitably used in the present invention.

Examples of such pigments include, but are not limited to, azo pigments, such as C.I. Pigment Orange 1, C.I. Pigment Orange 5, C.I. Pigment Orange 13, C.I. Pigment Orange 15, C.I. Pigment Orange 16, C.I. Pigment Orange 34, C.I. Pigment Orange 36, C.I. Pigment Orange 38, C.I. Pigment Orange 62, C.I. Pigment Orange 64, C.I. Pigment Orange 67, C.I. Pigment Orange 72, C.I. Pigment Orange 74, C.I. Pigment Red 2, C.I. Pigment Red 3, C.I. Pigment Red 4, C.I. Pigment Red 5, C.I. Pigment Red 12, C.I. Pigment Red 16, C.I. Pigment Red 17, C.I. Pigment Red 23, C.I. Pigment Red 31, C.I. Pigment Red 32, C.I. Pigment Red 41, C.I. Pigment Red 17, C.I. Pigment Red 48, C.I. Pigment Red 48:1, C.I. Pigment Red 48:2, C.I. Pigment Red 53:1, C.I. Pigment Red 57:1, C.I. Pigment Red 112, C.I. Pigment Red 144, C.I. Pigment Red 146, C.I. Pigment Red 166, C.I. Pigment Red 170, C.I. Pigment Red 176, C.I. Pigment Red 185, C.I. Pigment Red 187, C.I. Pigment Red 208, C.I. Pigment Red 210, C.I. Pigment Red 220, C.I. Pigment Red 221, C.I. Pigment Red 238, C.I. Pigment Red 242, C.I. Pigment Red 245, C.I. Pigment Red 253, C.I. Pigment Red 258, C.I. Pigment Red 266, C.I. Pigment Red 269, C.I. Pigment Violet 13, C.I. Pigment Violet 25, C.I. Pigment Violet 32, C.I. Pigment Violet 50, C.I. Pigment Blue 25, C.I. Pigment Blue 26, C.I. Pigment Brown 23, C.I. Pigment Brown 25, and C.I. Pigment Brown 41. These pigments may be crude pigments.

The mass ratio of a pigment to a polyester having a bisazo dye skeleton in a pigment composition according to an embodiment of the present invention is preferably in the range of 100:1 to 100:100, more preferably 100:5 to 100:50 so as to improve pigment dispersibility.

The pigment composition may contain a resin. A resin for use in the pigment composition is not particularly limited and may be selected for each application of the pigment composition. Specific examples of the resin include, but are not limited to, polystyrene resin, styrene copolymer, poly(acrylic acid) resin, poly(methacrylic acid) resin, polyacrylate resin, polymethacrylate resin, acrylate copolymer, methacrylate copolymer, polyester resin, poly(vinyl ether) resin, poly(vinyl alcohol) resin, poly(vinyl butyral) resin, polyurethane resin, and polypeptide resin. These resins may be used alone or in combination. The pigment composition manufactured may be isolated by a known method, for example, filtration, decantation, or centrifugation. The solvent may be removed by washing.

Auxiliary agents may be used in the manufacture of the pigment composition. Examples of the auxiliary agents include, but are not limited to, surfactants, pigment and non-pigment dispersants, fillers, standardizers, resins, waxes, antifoaming agents, antistatic agents, dustproofing agents, extenders, shading colorants, preservatives, drying control chemical additives, rheology control additive agents, wetting agents, antioxidants, UV absorbers, light stabilizers, and combinations thereof.

A pigment dispersion according to an embodiment of the present invention will be described below. A pigment dispersion according to an embodiment of the present invention contains a polyester having a bisazo dye skeleton, an azo pigment, and a water-insoluble solvent. In order to produce a pigment dispersion according to an embodiment of the present invention, the pigment composition may be dispersed in a water-insoluble solvent, or the components of the pigment composition may be dispersed in a water-insoluble solvent, as specifically described below. A compound according to an embodiment of the present invention and a resin may be dissolved in a water-insoluble solvent. A pigment or a pigment composition powder may be blended with the water-insoluble solvent while stirring. The pigment can be stably, uniformly, and finely dispersed by mechanical shear force with a dispersing apparatus, such as a ball mill, a paint shaker, a dissolver, an attritor, a sand mill, or a high-speed mill.

A water-insoluble solvent for use in the pigment dispersion is not particularly limited and may be selected for each application of the pigment dispersion. The term "water-insoluble solvent", as used herein, refers to a solvent not soluble in water or a solvent that has a solubility of 30% by mass or less in water at 25° C. Specific examples of the water-insoluble solvent include, but are not limited to, esters, such as methyl acetate, ethyl acetate, and propyl acetate; hydrocarbons, such as hexane, octane, isooctane, decane, isodecane, decalin, nonane, dodecane, isododecane, petroleum ether, cyclohexane, benzene, toluene, xylene, mineral spirit, and Isopar E, Isopar G, Isopar H, Isopar L, Isopar M, and Isopar V, manufactured by Exxon Mobil Corp., and Shellsol A100 and Shellsol A150 manufactured by Shell Chemicals Japan Ltd.; halogen-containing hydrocarbons, such as chloroform, carbon tetrachloride, dichloroethane, trichloroethylene, and tetrabromoethane; ketones, such as methyl ethyl ketone, methyl isobutyl ketone, methyl n-amyl ketone, and cyclohexanone; glycol ether esters, such as ethylene glycol monobutyl ether acetate, 3-methoxybutyl acetate, diethylene glycol monobutyl ether acetate, and propylene glycol monomethyl ether acetate.

The water-insoluble solvent for use in the pigment dispersion may be a polymerizable monomer. Specific examples of the polymerizable monomer include, but are not limited to, styrene monomers, such as styrene, α-methylstyrene, α-ethylstyrene, o-methylstyrene, m-methylstyrene, p-methylstyrene, p-methoxystyrene, p-phenylstyrene, p-chlorostyrene, 3,4-dichlorostyrene, p-ethylstyrene, 2,4-dimethylstyrene, p-n-butylstyrene, p-tert-butylstyrene, p-n-hexylstyrene, p-n-octylstyrene, p-n-nonylstyrene, p-n-decylstyrene, and p-n-dodecylstyrene; olefin monomers, such as ethylene, propylene, butylene, and isobutylene; vinyl halides, such as vinyl chloride, vinylidene chloride, vinyl bromide, and vinyl iodide; vinyl esters, such as vinyl acetate, vinyl propionate, and vinyl benzoate; methacrylate monomers, such as methyl methacrylate, ethyl methacrylate, propyl methacrylate, butyl methacrylate, n-octyl methacrylate, dodecyl methacrylate, 2-ethylhexyl methacrylate, stearyl methacrylate, behenyl methacrylate, phenyl methacrylate, dimethylaminoethyl methacrylate, diethylaminoethyl methacrylate, and methacrylonitrile; acrylate monomers, such as methyl acrylate, ethyl acrylate, n-butyl acrylate, isobutyl acrylate, propyl acrylate, n-octyl acrylate, dodecyl acrylate, 2-ethylhexyl acrylate, stearyl acrylate, behenyl acrylate, 2-chloroethyl acrylate, acrylonitrile, acrylamide, and phenyl acrylate; vinyl ethers, such as vinyl methyl ether, vinyl ethyl ether, and vinyl isobutyl ether; and vinyl ketone compounds, such as vinyl methyl ketone, vinyl hexyl ketone, and methyl isopropenyl ketone. These polymerizable monomers may be used alone or in combination for each application.

In order to improve pigment dispersibility, the water-insoluble solvent for use in the pigment dispersion may be mixed with an organic solvent. Examples of the organic solvent include, but are not limited to, alcohols and phenols, such as methanol, ethanol, propanol, and phenol; ketones, such as acetone; ethers, such as diethyl ether, dipropyl ether, tetrahydrofuran, and dioxane; glycol ethers, such as ethylene glycol monoethyl ether and diethylene glycol monoethyl ether; and aliphatic carboxylic acids and acid anhydrides thereof, such as acetic acid, 2-ethylhexanoic acid, and acetic anhydride. These organic solvents may be used alone or in combination.

The resin for use in the pigment dispersion may be selected for each application of the pigment composition. Specific examples of the resin include, but are not limited to, polystyrene resin, styrene copolymer, poly(acrylic acid) resin, poly(methacrylic acid) resin, polyacrylate resin, polymethacrylate resin, acrylate copolymer, methacrylate copolymer, polyester resin, poly(vinyl ether) resin, poly(vinyl alcohol) resin, poly(vinyl butyral) resin, polyurethane resin, and polypeptide resin. These resins may be used alone or in combination.

An ink according to an embodiment of the present invention will be described below.

A pigment dispersion according to an embodiment of the present invention is suitable as a colorant for inks. A pigment dispersion according to an embodiment of the present invention can be used to provide an ink having satisfactory pigment dispersibility.

In order to control surface tension and viscosity, an ink according to an embodiment of the present invention may contain an organic solvent that is miscible with the water-insoluble solvent used in the pigment dispersion. Examples of the organic solvent include, but are not limited to, alcohols and phenols, such as methanol, ethanol, propanol, and phenol; ketones, such as acetone; ethers, such as diethyl ether, dipropyl ether, tetrahydrofuran, and dioxane; glycol ethers, such as ethylene glycol monoethyl ether and diethylene glycol monoethyl ether; and aliphatic carboxylic acids and acid anhydrides thereof, such as acetic acid, 2-ethylhexanoic acid, and acetic anhydride. These organic solvents may be used alone or in combination.

The colorant for inks for use in embodiments of the present invention includes a pigment dispersion according to an embodiment of the present invention. The pigment dispersion may be used in combination with another colorant that does not significantly impair the dispersibility of the pigment dispersion.

Examples of such a colorant that may be used in combination with the pigment dispersion include, but are not limited to, condensed azo compounds, isoindolinone compounds, anthraquinone compounds, azo metal complexes, methine compounds, and allylamide compounds. More specifically, the colorant may be a yellow pigment, such as C.I. Pigment Yellow 12, C.I. Pigment Yellow 13, C.I. Pigment Yellow 14, C.I. Pigment Yellow 15, C.I. Pigment Yellow 17, C.I. Pigment Yellow 62, C.I. Pigment Yellow 83, C.I. Pigment Yellow 94, C.I. Pigment Yellow 95, C.I. Pigment Yellow 97, C.I. Pigment Yellow 109, C.I. Pigment Yellow 110, C.I. Pigment Yellow 111, C.I. Pigment Yellow 120, C.I. Pigment Yellow 127, C.I.

Pigment Yellow 129, C.I. Pigment Yellow 147, C.I. Pigment Yellow 151, C.I. Pigment Yellow 154, C.I. Pigment Yellow 168, C.I. Pigment Yellow 174, C.I. Pigment Yellow 176, C.I. Pigment Yellow 181, C.I. Pigment Yellow 185, C.I. Pigment Yellow 191, C.I. Pigment Yellow 194, C.I. Pigment Yellow 213, C.I. Pigment Yellow 214, C.I. Vat Yellow 1, 3, and 20, mineral fast yellow, navel yellow, Naphthol Yellow S, Hansa Yellow G, Permanent Yellow NCG, C.I. Solvent Yellow 9, C.I. Solvent Yellow 17, C.I. Solvent Yellow 24, C.I. Solvent Yellow 31, C.I. Solvent Yellow 35, C.I. Solvent Yellow 58, C.I. Solvent Yellow 93, C.I. Solvent Yellow 100, C.I. Solvent Yellow 102, C.I. Solvent Yellow 103, C.I. Solvent Yellow 105, C.I. Solvent Yellow 112, C.I. Solvent Yellow 162, or C.I. Solvent Yellow 163.

The colorant may be a red pigment, such as C.I. Pigment Red 9, C.I. Pigment Red 97, C.I. Pigment Red 122, C.I. Pigment Red 146, C.I. Pigment Red 168, C.I. Pigment Red 177, C.I. Pigment Red 216, C.I. Pigment Red 224, C.I. Pigment Red 226, C.I. Pigment Red 242, or C.I. Pigment Red 254, a green pigment, such as C.I. Pigment Green 7, C.I. Pigment Green 36, or poly(12 to 16)bromophthalocyanine green, a blue pigment, such as C.I. Pigment Blue 15:3, C.I. Pigment Blue 15:6, or C.I. Pigment Blue 60, or a purple pigment, such as C.I. Pigment Violet 19 or C.I. Pigment Violet 23.

In addition to these components, an ink according to an embodiment of the present invention may contain various additive agents, such as a plasticizer, a surfactant, a viscosity modifier, an antifoaming agent, an ultraviolet absorber, an anticorrosive, an antioxidant, a reduction inhibitor, an evaporation accelerator, and/or a chelator.

An ink according to an embodiment of the present invention has satisfactory pigment dispersibility and color tone. Thus, when the ink has a color filter resist composition described below, the ink can be used for the color filter.

A color filter resist composition according to an embodiment of the present invention will be described below.

A color filter resist composition according to an embodiment of the present invention contains a binder resin and a pigment dispersion. Use of a pigment dispersion according to an embodiment of the present invention allows pigment dispersion to be maintained satisfactory, thereby providing a color filter resist composition having excellent color characteristics.

In a color filter that has two or more adjacent pixels having different spectral characteristics on a substrate, use of a pigment dispersion according to an embodiment of the present invention in at least one of the pixels (for example, red, green, and blue) can provide a pixel having high transparency and color purity. In particular, use of a pigment dispersion according to an embodiment of the present invention in colorants for the tone adjustment of green and red pixels can provide a color filter resist composition having excellent color characteristics.

Examples of the binder resin for use in the color filter resist composition include, but are not limited to, known nonreactive random copolymers, block copolymers, and graft copolymers, copolymers having reactive groups, middle-molecular-weight oligomers having reactive groups, monomers having reactive groups, and polymers containing cross-linkers. The reactive groups may be selected in accordance with the method for curing a color ink and include, but are not limited to, known groups, such as a methylol group, an isocyanate group, an epoxy group, an oxetane group, a vinyl group, an acryloyl group, a methacryloyl group, a hydroxy group, a carboxy group, an amino group, and an imino group, and reactive derivatives thereof.

Examples of monomers for a heat-drying or thermal-crosslinking polymer include, but are not limited to, alkyl esters, cycloalkyl esters, and alkylcycloalkyl esters of $\alpha,\beta$-ethylenically unsaturated carboxylic acid, such as acrylic acid or methacrylic acid, ethylene, propylene, butylene, isobutylene, butadiene, isoprene, and aromatic vinyl monomers, such as styrene, $\alpha$-methylstyrene, and vinylnaphthalene. A macromonomer having a hydrophobic molecular chain may have an $\alpha,\beta$-ethylenically unsaturated group bonded to a homopolymer or copolymer chain of the monomer having a hydrophobic group described above.

Examples of reactive monomers for use in the heat-drying or thermal-crosslinking polymer include, but are not limited to, acrylic acid, methacrylic acid, maleic acid, 2-hydroxyalkyl acrylates, 2-hydroxyalkyl methacrylates, glycidyl acrylate, glycidyl methacrylate, N-methylolacrylamide, N-methylolmethacrylamide, N-methoxymethylacrylamide, N-methoxymethylmethacrylamide, N-methylolmelamine, N-methylolbenzoguanamine, $\gamma$-methacryloxypropyltrimethoxysilane, isocyanatoethyl acrylate, isocyanatoethyl methacrylate, and 2-(p-isopropenylphenyl)propyl(2-)isocyanate. A macromonomer having a molecular chain having a group that can react with a cross-linker may be a macromonomer having an $\alpha,\beta$-ethylenically unsaturated group bonded to a (co)polymer chain of one of the reactive monomers described above or a copolymer chain of one of the reactive monomers and the hydrophobic monomer described above.

Examples of the cross-linker include, but are not limited to, trimethylolpropane polyglycidyl ether, pentaerythritol polyglycidyl ether, methoxymethylol melamine, butoxymethylol melamine, methoxymethylol benzoguanamine, multi-branched polycarbodiimide, which is a urethane reaction product of poly(hexamethylenecarbodiimide)diisocyanate, bis-monomethoxy poly(ethylene glycol), and polyoxyethylenesorbitol monolaurate, and phenol-blocked isocyanates of trimethylolpropane-tris(tolylene diisocyanate adduct) and trimethylolpropane-tris(hexamethylene diisocyanate adduct).

A binder resin for use in an ultraviolet radical curable, cationic photopolymerizable, electron beam curable, or thermal polymerizable ink may be a known monomer, oligomer, or polymer having an addition polymerizable or addition cross-linkable unsaturated double bond or a polymerizable cyclic ether group.

Examples of addition polymerizable oligomers and polyfunctional monomers include, but are not limited to, urethane acrylates, such as (poly(tetramethylene glycol)-hexamethylene diisocyanate polyurethane)-bisacrylate; epoxy acrylates, such as bisphenol A epoxy resin-bisacrylate and phenol novolak epoxy resin-polyacrylate; and poly(hexylene isophthalate)-bisacrylate, (trimethylolpropane-adipic acid polyester)-polyacrylate, tetraethylene glycol diacrylate, tripropylene glycol diacrylate, tricyclodecane dimethanol diacrylate, bisphenol A-ethylene oxide adduct diacrylate, trimethylolpropane triacrylate, pentaerythritol triacrylate, pentaerythritol tetraacrylate, and dipentaerythritol hexaacrylate.

Examples of alicyclic diepoxy compounds include, but are not limited to, 3,4-epoxycyclohexylmethyl(3,4-epoxy)cyclohexane carboxylate and limonene dioxide. Examples of oxetane compounds include, but are not limited to, oxetane alcohol, dioxetane, phenyl oxetane, xylylene dioxetane, and 2-ethylhexyl oxetane. Examples of vinyl ether compounds include, but are not limited to, triethylene glycol divinyl ether and 1,4-cyclohexanedimethanol divinyl ether.

An ultraviolet radical curable, cationic photopolymerizable, electron beam curable, or thermal polymerizable color filter resist composition contains an initiator. Examples of photopolymerization initiators for use in the color filter resist composition include, but are not limited to, 1-hydroxycyclohexyl phenyl ketone, 2,2-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2-methyl-1-phenyl-propan-1-one, 1-[4-(2-hydroxyethoxy)phenyl]-2-hydroxy-2-methyl-1-propan-1-one, 2,4,6-trimethylbenzoyldiphenyl-phosphine oxide, bisacylphosphine oxide, benzoin ethyl ether, benzoin isobutyl ether, benzoin isopropyl ether, 2-isopropylthioxanthone, 2,4-diethylthioxanthone, 2-(3-dimethylamino-2-hydroxypropoxy)-3,4-dimethyl-9H-thioxanthon-9-one methochloride, benzophenone, methyl o-benzoyl benzoate, 4-benzoyl-4'-methyl-diphenyl sulfide, 3,3',4,4'-tetra(tert-butylperoxycarbonyl), ethyl p-dimethylamino benzoate, isoamyl p-dimethylamino benzoate, 1,3,5-triacryloyl hexahydro-s-triazine, 2-[2-(5-methylfuran-2-yl)ethenyl]-4,6-bis(trichloromethyl)-s-triazine, 2-[2-(furan-2-yl)ethenyl]-4,6-bis(trichloromethyl)-s-triazine, methyl benzoylformate, and 2,4,6-trimethylbenzoyldiphenylphosphine oxide. Examples of cationic photoinitiators include, but are not limited to, triarylsulfonium salt and aryliodonium salt. Examples of sensitizers include, but are not limited to, 1-chloro-4-propoxythioxanthone. Examples of thermal polymerization initiators include, but are not limited to, azobisisobutyronitrile, azobiscyanoisovaleric acid, and dimethyl 2,2'-azobisisobutyrate.

In order to dissolve or disperse the binder resin, the polymerization initiator, and the colorant, the color filter resist composition may contain an organic solvent that is miscible with the water-insoluble solvent used in the pigment dispersion. Examples of the organic solvent include, but are not limited to, alcohols and phenols, such as methanol, ethanol, propanol, and phenol; ketones, such as acetone; ethers, such as diethyl ether, dipropyl ether, tetrahydrofuran, and dioxane; glycol ethers, such as ethylene glycol monoethyl ether and diethylene glycol monoethyl ether; and aliphatic carboxylic acids and acid anhydrides thereof, such as acetic acid, 2-ethylhexanoic acid, and acetic anhydride. These organic solvents may be used alone or in combination.

When the color filter resist composition is applied to a glass substrate, the addition of a silane coupling agent having a reactive organic functional group to the resist composition can improve the adhesion of the resulting color film to the glass substrate, thereby producing excellent film performance. The silane coupling agent may be a known silane coupling agent. Examples of the silane coupling agent having a reactive organic functional group include, but are not limited to, silane coupling agents having an epoxy group, a thiol group, a hydroxy group, an amino group, a ureide group, a vinyl group, and/or an acryloyl group. Specific examples of the silane coupling agent include, but are not limited to, β-(3,4-epoxycyclohexyl)ethyltrimethoxysilane, γ-glycidoxypropyltrimethoxysilane, γ-mercaptopropyltrimethoxysilane, γ-aminopropyltriethoxysilane, N-β-(aminoethyl)-γ-aminopropyltrimethoxysilane, γ-ureidopropyltriethoxysilane, vinyltriethoxysilane, vinyltris(β-methoxyethoxy)silane, and γ-methacryloxypropyltrimethoxysilane.

As described above, a color filter resist composition according to an embodiment of the present invention contains a pigment dispersion according to an embodiment of the present invention as a colorant. Thus, the resist composition has satisfactory pigment dispersibility and excellent color characteristics.

Examples

Unless otherwise specified, "part" and "%" in the following description are based on mass.

The following are measurement methods used in the present examples.

(1) Measurement of Molecular Weight

The molecular weights of a polyester resin (polyester moiety) and a polyester having a bisazo dye skeleton were polystyrene equivalents determined by size exclusion chromatography (SEC). The molecular weight based on SEC was measured as described below.

A sample diluted to a concentration of 1.0% with an eluent was left still at room temperature for 24 hours and was passed through a solvent resistant membrane filter having a pore size of 0.2 µm. The molecular weight of the resulting sample solution was measured under the following conditions.

Apparatus: high performance GPC "HLC-8220 GPC" [manufactured by Tosoh Corp.]

Column: two LF-804 in series

Eluent: THF

Flow rate: 1.0 ml/min

Oven temperature: 40° C.

Sample injection: 0.025 ml

The molecular weight of the sample was calculated from a molecular weight calibration curve, which was prepared using standard polystyrene resins [TSK standard polystyrene F-850, F-450, F-288, F-128, F-80, F-40, F-20, F-10, F-4, F-2, F-1, A-5000, A-2500, A-1000, and A-500 manufactured by Tosoh Corp.].

(2) Measurement of Acid Value

The acid values of a polyester resin (polyester moiety) and a polyester having a bisazo dye skeleton were measured by the following method.

The basic procedures complied with JIS K-0070.

1) 0.5 to 2.0 g of a sample was precisely weighed. The mass was denoted as W (g).

2) The sample was dissolved in 25 ml of a tetrahydrofuran/ethanol (2/1) mixture in a 50-ml beaker.

3) The sample was titrated with 0.1 mol/1 KOH in ethanol using a potentiometric titrator [for example, an automatic titrator "COM-2500" manufactured by Hiranuma Sangyo Co., Ltd.].

4) The amount of KOH solution used was denoted as S (ml). The amount of KOH solution used for blank measurement was denoted as B (ml).

5) The acid value was calculated using the following equation. f denotes the factor of the KOH solution.

$$\text{Acid value[mgKOH/g]} = \frac{(S-B) \times f \times 5.61}{W} \quad \text{[Math. 1]}$$

(3) Composition Analysis

The structures of a polyester resin and a polyester having a bisazo dye skeleton were determined with the following apparatus.

$^1$H NMR

ECA-400 manufactured by JEOL Ltd. (solvent: deuteriochloroform)

The polyester resin $P_1$ was prepared by the following method.

Synthesis Example 1 of Polyester Resin 31.6 parts of a 1.0 mol ethylene oxide adduct of bisphenol A, 14.8 parts of terephthalic acid, 5.5 parts of a cross-linker glycerin, and 0.0005 parts of a catalyst di-n-butyltin oxide in a four-neck flask were melted and stirred at 200° C. in an inert nitrogen gas atmosphere. When the production of a by-product water was completed, the resulting mixture was heated to 230° C. for approximately one hour and was stirred for two hours. A resin in a molten state was removed. The resin was cooled at normal temperature and was washed with water to yield a resin (A). The physical properties of the resin (A) were measured with the apparatuses described above. The analysis results were as follows:

Analysis Results for Resin (A)
 [1] Molecular Weight Measurement (GPC):
  Weight-average molecular weight (Mw)=10508
  Number-average molecular weight (Mn)=3543
 [2] Acid Value Measurement:
  11.6 mgKOH/g
 [3] $^1$H NMR (400 MHz, CDCl$_3$, at room temperature): δ [ppm]=8.06 (3.7H, s), 7.15 (4H, d), 6.89 (4H, d), 5.48-5.32 (0.6H, m), 4.72-3.63 (2.4, m), 1.68 (6H, s), 1.47 (4H, d), 1.42-1.22 (4H, m)

Synthesis Example 2 of Polyester Resin 200 parts of 12-hydroxystearic acid, 8.24 parts of stearic acid for blocking a terminal hydroxy group, and 56.8 parts of xylene in a four-neck flask were melted at 140° C. 0.485 parts of a catalyst titanium tetraisopropoxide was added to the resulting liquid mixture, and the liquid mixture was heated to 180° C. The liquid mixture was stirred at 180° C. for 42 hours while a by-product water was removed. After the completion of the reaction, xylene was distilled off, and the product was dried under reduced pressure to yield a resin (B). The physical properties of the resin (B) were measured with the apparatuses described above. The analysis results were as follows:

Analysis Results for Resin (B)
 [1] Molecular Weight Measurement (GPC):
  Weight-average molecular weight (Mw)=5069
  Number-average molecular weight (Mn)=2636
 [2] Acid Value Measurement:
  31.9 mgKOH/g
 [3] $^1$H NMR (400 MHz, CDCl$_3$, at room temperature): δ [ppm]=4.99 (1H, m), 2.19 (2H, t), 2.10 (0.5H, t), 1.61-1.42 (7H, m), 1.28-1.15 (28H, m), 0.88 (4H, t)

Synthesis Example 3 of Polyester Resin 50.0 parts of ε-caprolactone and 0.57 parts of 2-ethylhexanol were mixed in a four-neck flask and were melted at 120° C. 0.04 parts of a catalyst titanium tetraisopropoxide was added to the resulting liquid mixture, and the liquid mixture was stirred for five hours. After the completion of the reaction, the resulting product was diluted with THF and was reprecipitated in methanol. The resulting precipitate was filtered off to yield a resin (C). The physical properties of the resin (C) were measured with the apparatuses described above. The analysis results were as follows:

Analysis Results for Resin (C)
 [1] Molecular Weight Measurement (GPC):
  Weight-average molecular weight (Mw)=7198
  Number-average molecular weight (Mn)=9722
 [2] Acid Value Measurement:
  1.13 mgKOH/g
 [3] $^1$H NMR (400 MHz, CDCl$_3$, at room temperature): δ [ppm]=4.06 (78H, t), 3.65 (2H, t), 2.63 (0.5H, t), 2.31 (78H, t), 1.67-1.22 (243H, m), 0.89 (2.5H, m)

In the same way as the resins (A) to (C), resins (D) to (J) listed in Table 1 were prepared. The results are described below.

TABLE 1

Polyester Resins (A) to (J)

| Resin symbol | Components | | Cross-linker |
|---|---|---|---|
| | Monomer unit A | Monomer unit B | |
| Resin (A) | $-(-\overset{\text{O}}{\underset{\|}{C}}-C_6H_4-\overset{\text{O}}{\underset{\|}{C}}-)-$ | $-(-OC_2H_5-O-C_6H_4-C(CH_3)_2-C_6H_4-O-C_2H_5O-)-$ | None |
| Resin (B) | $-(-\overset{\text{O}}{\underset{\|}{C}}-C_{10}H_{20}-\overset{\text{H}}{\underset{C_6H_{13}}{C}}-O-)-$ | None | None |
| Resin (C) | $-(-\overset{\text{O}}{\underset{\|}{C}}-C_5H_{10}-O-)-$ | None | None |
| Resin (D) | $-(-\overset{\text{O}}{\underset{\|}{C}}-C_5H_{10}-O-)-$ | None | None |
| Resin (E) | $-(-\overset{\text{O}}{\underset{\|}{C}}-C_5H_{10}-O-)-$ | None | None |

TABLE 1-continued

Polyester Resins (A) to (J)

| Resin | Structure 1 | Structure 2 | Additional |
|---|---|---|---|
| Resin (F) | [diacid with 1,3-benzenedicarbonyl] | [—(O(CH₃)CHCH₂O)₂—C₆H₄—C(CH₃)₂—C₆H₄—O—(CH₂CH(CH₃)O)₂—] | Trimellitic acid |
| Resin (G) | [—(C(=O)—C₇H₁₄—C(=O)—O)—] | —(O—C₁₀H₂₀—O)— | None |
| Resin (H) | [—(C(=O)—C₇H₁₄CH=CHCH₂CH(C₆H₁₃)—O)—] | None | None |
| Resin (I) | [—(C(=O)—C₃H₆—CH(CH₃)—O)—] | None | None |
| Resin (J) | [maleate/fumarate unit] | —(O—C₄H₈—O)— | None |

| Resin symbol | COOH group blocker | OH group blocker | Mw |
|---|---|---|---|
| Resin (A) | None | None | 10508 |
| Resin (B) | None | Stearic acid | 5069 |
| Resin (C) | 2-ethylhexanol | None | 7198 |
| Resin (D) | 2-(4-nitrophenyl)ethanol | None | 9722 |
| Resin (E) | None | Isostearic acid | 10231 |
| Resin (F) | None | None | 9854 |
| Resin (G) | None | None | 18240 |
| Resin (H) | None | Oleic acid | 6996 |
| Resin (I) | None | None | 11256 |
| Resin (J) | None | None | 16550 |

A polyester having the bisazo dye skeleton represented by the formula (1) or (2) was prepared by the following method.

Synthesis Example 1 of Azo Dye Intermediate (74)

An azo dye intermediate (74) having the following structure was prepared in accordance with the following scheme.

[Chem. 10]

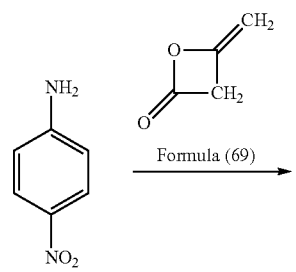

Formula (68)

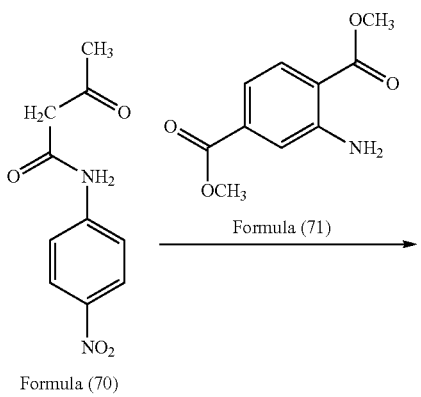

Formula (70)

-continued

Formula (71)

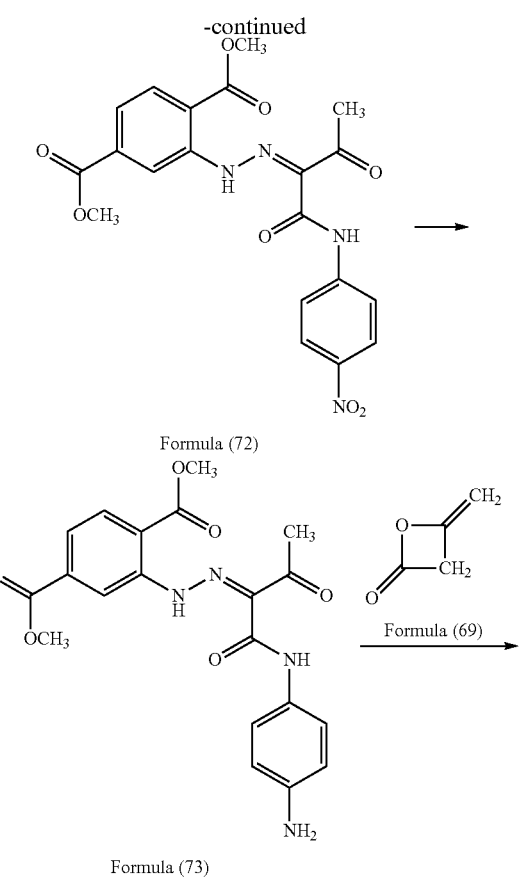

Formula (72)

Formula (73)

Formula (74)

3.11 parts of p-nitroaniline (68) was added to 30 parts of chloroform. The resulting mixture was cooled in ice to 10° C. or less. 1.89 parts of diketene (69) was added to the mixture. The mixture was stirred at 65° C. for two hours. After the completion of the reaction, a chloroform extract was concentrated to yield 4.80 parts of a compound (70) (yield: 96.0%).

40.0 parts of methanol and 5.29 parts of concentrated hydrochloric acid were added to 4.25 parts of dimethyl 2-aminoterephthalate (71). The resulting mixture was cooled in ice to 10° C. or less. 2.10 parts of sodium nitrite dissolved in 6.00 parts of water was added to the mixture. The mixture was allowed to react at that temperature for one hour. 0.990 parts of sulfamic acid was added to the mixture. The mixture was stirred for 20 minutes to yield a diazonium salt solution. 4.51 parts of the compound (70) was added to 70.0 parts of methanol. The resulting mixture was cooled in ice to 10° C. or less. The diazonium salt solution was added to the mixture. 5.83 parts of sodium acetate dissolved in 7.00 parts of water was added to the mixture. The mixture was allowed to react at 10° C. or less for two hours. After the completion of the reaction, 300 parts of water was added to the mixture. The mixture was stirred for 30 minutes and was passed through a filter to remove solids. Purification by recrystallization from N,N-dimethylformamide yielded 8.65 parts of a compound (72) (yield: 96.1%).

8.58 parts of the compound (72) and 0.40 parts of palladium-activated carbon (palladium: 5%) were added to 150 parts of N,N-dimethylformamide. The resulting mixture was stirred at 40° C. for three hours in a hydrogen gas atmosphere (reaction pressure: 0.1 to 0.4 MPa). After the completion of the reaction, the mixture was passed through a filter and was concentrated to yield 7.00 parts of a compound (73) (yield: 87.5%).

6.50 parts of the compound (73) was added to 30.0 parts of chloroform. The resulting mixture was cooled in ice to 10° C. or less. 0.95 parts of diketene (69) was added to the mixture. The mixture was stirred at 65° C. for two hours. After the completion of the reaction, a chloroform extract was concentrated to yield 6.92 parts of an azo dye intermediate (74) (yield: 93.0%).

Synthesis Example 1 of Polyester Having Bisazo Dye Skeleton

A polyester (35) having a bisazo dye skeleton was prepared from the azo dye intermediate (74) in accordance with the following scheme.

[Chem. 11]

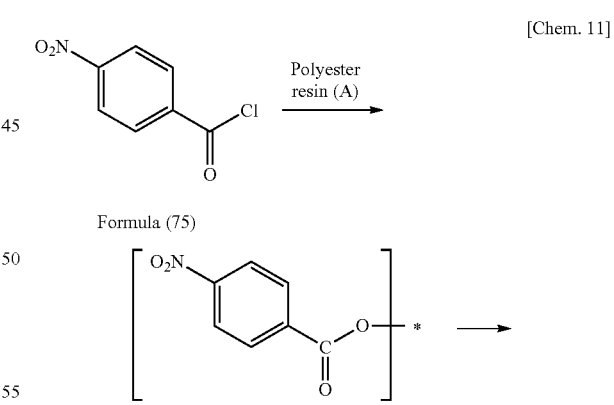

Formula (75)

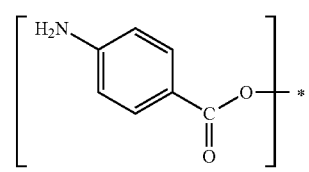

Formula (76)

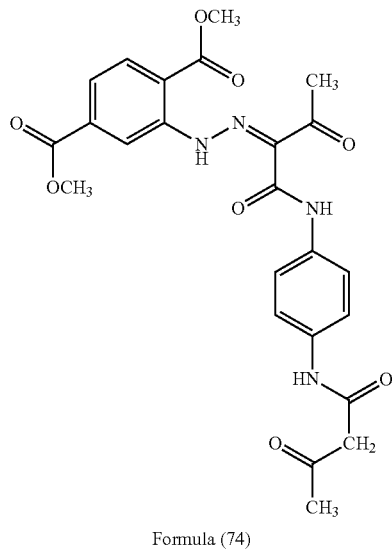 [SMILES: COC(=O)c1ccc(C(=O)OC)c(N/N=C(/C(C)=O)C(=O)Nc2ccc(NC(=O)CC(C)=O)cc2)c1]

Formula (77)

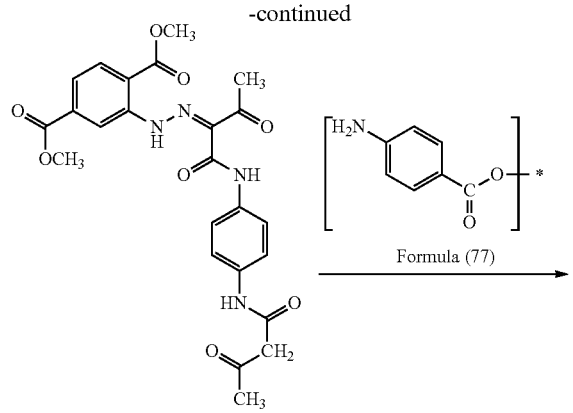

Formula (74)

"*" denoted a linkage with the polyester resin.

Polyester (35) having bis-azo dye skeleton 10.0 parts of the polyester resin (A) synthesized in Synthesis Example 1 was dissolved in 50.0 parts of pyridine and was cooled in ice to 10° C. or less. 2.00 parts of a compound (75) was added to the resulting solution. The solution was stirred at room temperature for 12 hours. After the completion of the reaction, an organic phase of the solution was extracted with chloroform and was washed with water. The solution which had been extracted with chloroform was concentrated and was purified by reprecipitation in methanol to yield 9.5 parts of a compound (76) (yield: 95.0%).

9.50 parts of the compound (76) and 0.66 parts of palladium-activated carbon (palladium: 5%) were added to 20.0 parts of dehydrated tetrahydrofuran and were stirred at room temperature for 48 hours in a hydrogen gas atmosphere (reaction pressure: 0.01 to 0.1 MPa). After the completion of the reaction, the resulting solution was passed through a filter and was concentrated to yield 8.7 parts of a compound (77) (yield: 91.6%).

40.0 parts of tetrahydrofuran and 0.50 parts of concentrated hydrochloric acid were added to 8.0 parts of the compound (77). The resulting mixture was cooled in ice to 10° C. or less. 0.18 parts of sodium nitrite dissolved in 0.60 parts of water was added to the mixture. The mixture was allowed to react at that temperature for one hour to yield a diazonium salt solution. 0.70 parts of the compound (74) was dissolved in 50.0 parts of N,N-dimethylformamide at 80° C. After the resulting solution was cooled to 50° C., 0.89 parts of potassium carbonate dissolved in 1.8 parts of water was added to the solution. The solution was cooled in ice to 10° C. or less. The diazonium salt solution was added to the solution and was allowed to react at 10° C. or less for two hours. After the completion of the reaction, the solution was concentrated. An organic phase of the solution was extracted with chloroform and was washed with water. The solution was concentrated and was purified by reprecipitation in methanol to yield 7.50 parts of the polyester (35) having a bisazo dye skeleton (yield: 93.8%).

The product was analyzed using the apparatuses described above and was found to have the structure described above. The analysis results were as follows: Analysis Results for Polyester (35) Having Bisazo Dye Skeleton

[1] Molecular Weight Measurement (GPC):
Weight-average molecular weight (Mw)=18065
Number-average molecular weight (Mn)=9523
[2] Acid Value Measurement:
0.3439 mgKOH/g

[3] $^1$H NMR (400 MHz, CDCl$_3$, at room temperature) (see FIG. 1): δ [ppm]=15.64 (s, 1H), 14.77 (s, 1H), 11.43 (s, 1H), 8.61 (s, 1H), 8.04 (m, 68H), 7.13 (m, 74H), 6.81 (m, 73H), 5.49-5.29 (m, 32H), 4.71 (m, 3H), 4.44 (m, 8H), 3.91 (m, 94H), 2.68 (s, 3H), 2.17 (s, 1H), 1.85-1.22 (m, 283H)

Synthesis Example 2 of Polyester Having Bisazo Dye Skeleton (38)

A polyester (38) having a bisazo dye skeleton was prepared from the azo dye intermediate (74) in accordance with the following scheme.

[Chem.12]

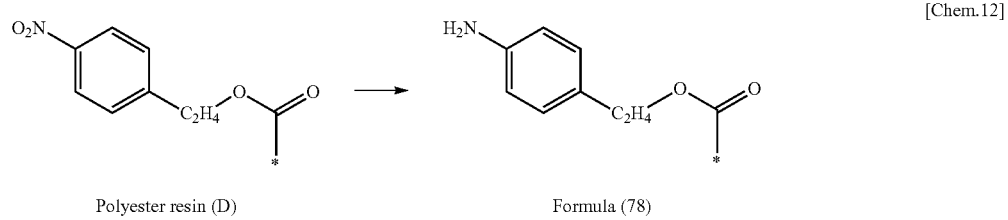

Polyester resin (D)  Formula (78)

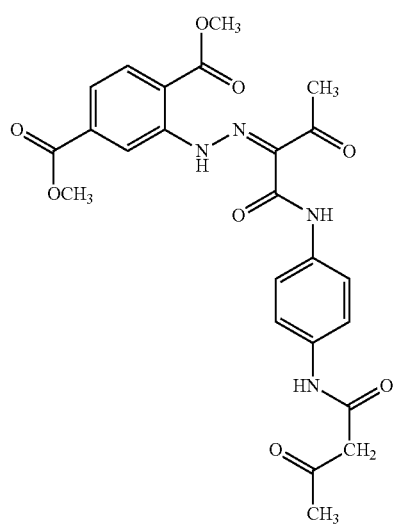

Formula (74)

"*" denotes a linkage with the polyester resin.

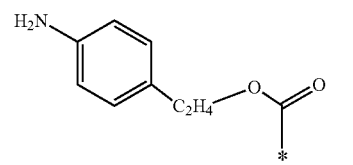

$$\xrightarrow{\text{Formula (78)}} \text{Polyester (38) having bis-azo dye skeleton}$$

20.0 parts of the polyester resin (D) synthesized in Synthesis Example 1 was dissolved in 50.0 parts of dehydrated tetrahydrofuran. 0.53 parts of palladium-activated carbon (palladium: 5%) was added to the resulting solution. The solution was stirred at room temperature for 24 hours in a hydrogen gas atmosphere (reaction pressure: 0.05 to 0.1 MPa). After the completion of the reaction, the solution was passed through a filter and was concentrated to yield 18.3 parts of a compound (78) (yield: 91.5%).

50.0 parts of tetrahydrofuran and 0.69 parts of concentrated hydrochloric acid were added to 15.0 parts of the compound (78). The resulting mixture was cooled in ice to 10° C. or less. 0.29 parts of sodium nitrite dissolved in 0.87 parts of water was added to the mixture. The mixture was allowed to react at that temperature for one hour to yield a diazonium salt solution. 1.17 parts of the compound (74) was dissolved in 75.0 parts of N,N-dimethylformamide at 80° C. After the resulting solution was cooled to 50° C., 1.41 parts of potassium carbonate dissolved in 2.80 parts of water was added to the solution. The solution was cooled in ice to 10° C. or less. The diazonium salt solution was added to the solution and was allowed to react at 10° C. or less for two hours. After the completion of the reaction, the solution was concentrated. An organic phase of the solution was extracted with chloroform and was washed with water. The solution was concentrated and was purified by reprecipitation in methanol to yield 11.0 parts of the polyester (38) having a bisazo dye skeleton (yield: 73.3%).

The product was analyzed using the apparatuses described above and was found to have the structure described above. The analysis results were as follows: Analysis Results for Polyester (38) Having Bisazo Dye Skeleton

[1] Molecular Weight Measurement (GPC):
Weight-average molecular weight (Mw)=12242
Number-average molecular weight (Mn)=10636

[2] Acid Value Measurement:
1.449 mgKOH/g

Figure 2:
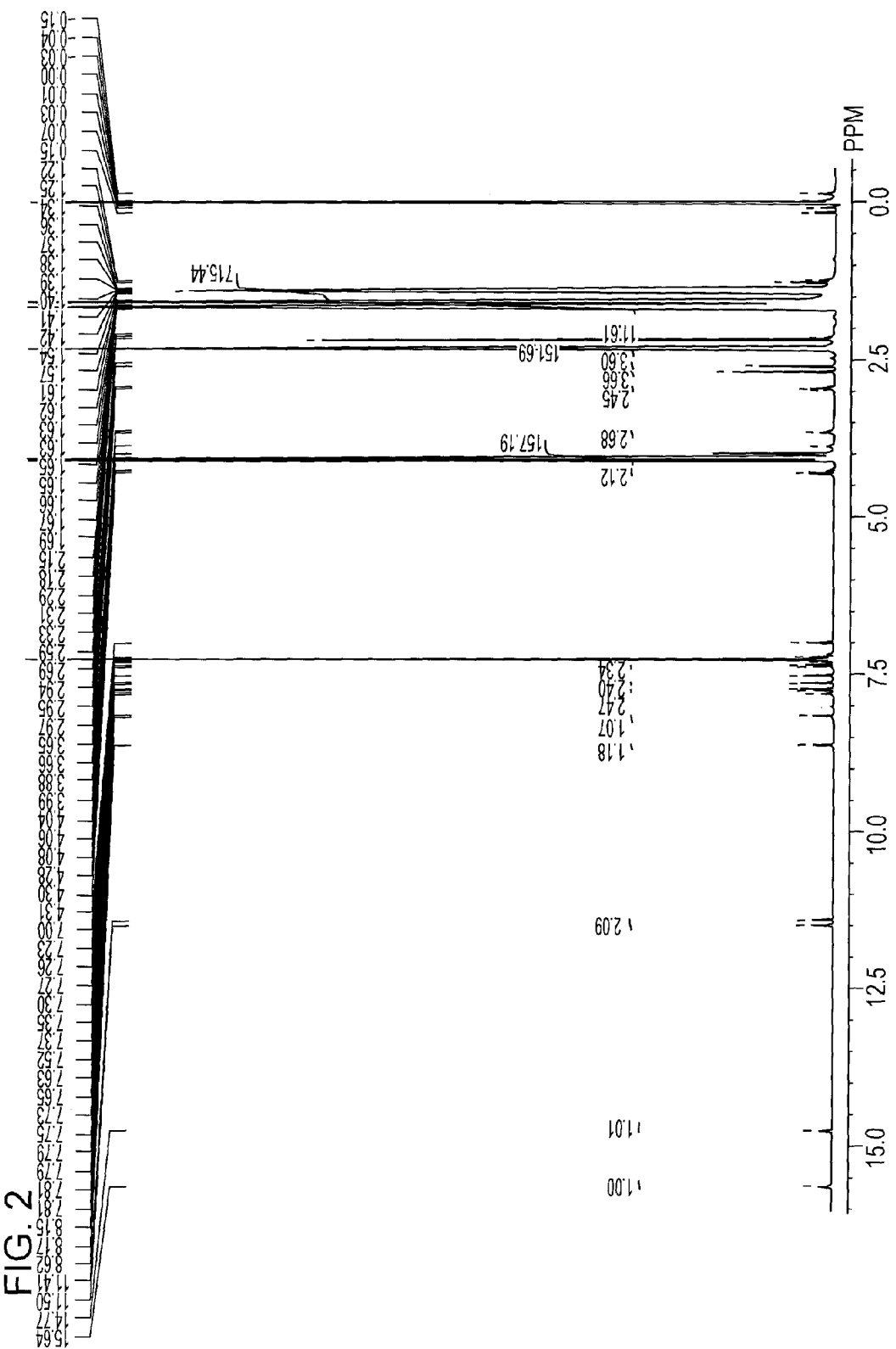
FIG. 2 is a $^1$H NMR spectrum of a polyester (38) having a bisazo dye skeleton measured at 400 MHz in CDCl$_3$ at room temperature.

[3] $^1$H NMR (400 MHz, CDCl$_3$, at room temperature) (see FIG. 2): δ [ppm]=15.64 (s, 1H), 14.77 (s, 1H), 11.50 (s, 1H), 11.41 (s, 1H), 8.62 (s, 1H), 8.16 (d, 1H), 7.79 (d, 1H), 7.74 (d, 2H), 7.64 (d, 2H), 7.52 (s, 2H), 7.36 (d, 2H), 4.30 (t, 2H), 4.06 (t, 157H), 3.65 (t, 2H), 2.95 (t, 2H), 2.69 (s, 3H), 2.59 (s, 3H), 2.31 (t, 152H), 1.69-1.22 (m, 715H)

Polyesters (36), (37), and (39) to (67) having the bisazo dye skeleton represented by the formula (1) or (2) were prepared in the same way as the polyesters (35) and (38) having a bisazo dye skeleton. Tables 2-1 and 2-2 listed the polyesters having a bisazo dye skeleton.

TABLE 2-1

Polyester Having Bis-Azo Dye Skeleton

| Compound No. | General formula | $R_1$ | $R_2$ | $R_3$ | $R_4$ | $R_5$ | $R_6$ | $R_7$ | $R_8$ | $R_9$ | $R_{10}$ | $R_{11}$ | Substitution position of $L_1$ in formulae (79) to (82) and structure of $L_1$ | | |
|---|---|---|---|---|---|---|---|---|---|---|---|---|---|---|---|
| | | | | | | | | | | | | | 2-position | 3-position | 4-position |
| (35) | (79) | H | H | H | H | CH$_3$ | CH$_3$ | COOCH$_3$ | H | H | COOCH$_3$ | H | H | H | —C(=O)—O—* |
| (36) | (79) | H | H | H | H | CH$_3$ | CH$_3$ | COOCH$_3$ | H | H | COOCH$_3$ | H | H | H | —C(=O)—O—* |

TABLE 2-1-continued

Polyester Having Bis-Azo Dye Skeleton

| | | | | | | | | | | | | | | |
|---|---|---|---|---|---|---|---|---|---|---|---|---|---|---|
| (37) | (79) | H | H | H | H | CH₃ | CH₃ | COOCH₃ | H | H | COOCH₃ | H | H | H | —C(=O)—O—* |
| (38) | (79) | H | H | H | H | CH₃ | CH₃ | COOCH₃ | H | H | COOCH₃ | H | H | H | —C₂H₄O—C(=O)—* |
| (39) | (79) | H | H | H | H | CH₃ | CH₃ | COOCH₃ | H | H | COOCH₃ | H | H | H | —C(=O)—O—* |
| (40) | (79) | H | H | H | H | CH₃ | CH₃ | COOCH₃ | H | H | COOCH₃ | H | H | H | —C(=O)—O—* |
| (41) | (79) | H | H | H | H | CH₃ | CH₃ | COOCH₃ | H | H | COOCH₃ | H | H | H | —C(=O)—O—* |
| (42) | (79) | H | H | H | H | CH₃ | CH₃ | COOCH₃ | H | H | COOCH₃ | H | H | H | —C(=O)—O—* |
| (43) | (79) | H | H | H | H | CH₃ | CH₃ | COOCH₃ | H | H | COOCH₃ | H | H | H | —C(=O)—O—* |
| (44) | (79) | H | H | H | H | CH₃ | CH₃ | COOCH₃ | H | H | COOCH₃ | H | H | H | —C(=O)—O—* |
| (45) | (79) | H | H | H | H | C₆H₁₃(n) | Ph | COOCH₃ | H | H | COOCH₃ | H | H | H | —C₂H₅O—C(=O)—* |
| (46) | (79) | Cl | H | H | H | CH₃ | CH₃ | COOCH₃ | H | H | COOCH₃ | H | H | H | —C₂H₅O—C(=O)—* |
| (47) | (79) | Cl | H | Cl | H | CH₃ | CH₃ | COOCH₃ | H | H | COOCH₃ | H | H | H | —C₂H₅O—C(=O)—* |
| (48) | (79) | H | H | H | H | CH₃ | CH₃ | COOCH₃ | H | H | COOCH₃ | H | H | —C(=O)—O—* | H |
| (49) | (79) | H | H | H | H | CH₃ | CH₃ | COOCH₃ | H | H | COOCH₃ | H | —C(=O)—O—* | H | H |
| (50) | (79) | H | H | H | H | CH₃ | CH₃ | COOCH₃ | H | H | COOCH₃ | H | H | —C(=O)—O—* | H |
| (51) | (79) | H | H | H | H | CH₃ | CH₃ | COOCH₃ | H | H | COOCH₃ | H | H | H | —S(=O)(=O)—O—* |

| Substitution position of $L_1$ in formulae (79) to (82) and structure of $L_1$ | | |
|---|---|---|
| 5-position | 6-position | Resin |
| H | H | (A) |
| H | H | (B) |
| H | H | (C) |
| H | H | (D) |
| H | H | (E) |
| H | H | (F) |
| H | H | (G) |
| H | H | (H) |
| H | H | (I) |
| H | H | (J) |
| H | H | (D) |
| H | H | (D) |
| H | H | (D) |

TABLE 2-1-continued

Polyester Having Bis-Azo Dye Skeleton

| | | |
|---|---|---|
| H | H | (C) |
| H | H | (C) |
| $-\overset{O}{\underset{\|}{C}}-O-*$ | H | (C) |
| H | H | (C) |

TABLE 2-2

Polyester Having Bis-Azo Dye Skeleton

| Compound No | General formula | $R_1$ | $R_2$ | $R_3$ | $R_4$ | $R_5$ | $R_6$ | $R_7$ | $R_8$ | $R_9$ | $R_{10}$ | $R_{11}$ | Substitution position of $L_1$ in formulae (79) to (82) and structure of $L_1$ | |
|---|---|---|---|---|---|---|---|---|---|---|---|---|---|---|
| | | | | | | | | | | | | | 2-position | 3-position |
| (52) | (79) | H | H | H | H | $CH_3$ | $CH_3$ | $COOCH_3$ | H | H | $COOCH_3$ | H | H | H |
| (53) | (79) | H | H | H | H | $CH_3$ | $CH_3$ | COOH | H | H | COOH | H | H | H |
| (54) | (79) | H | H | H | H | $CH_3$ | $CH_3$ | $COOC_2H_5$ | H | H | $COOC_2H_5$ | H | H | H |
| (55) | (79) | H | H | H | H | $CH_3$ | $CH_3$ | $COOC_3H_7(n)$ | H | H | $COOC_3H_7(n)$ | H | H | H |
| (56) | (79) | H | H | H | H | $CH_3$ | $CH_3$ | $COOC_3H_7(i)$ | H | H | $COOC_3H_7(i)$ | H | H | H |
| (57) | (79) | H | H | H | H | $CH_3$ | $CH_3$ | $CONH_2$ | H | H | $CONH_2$ | H | H | H |
| (58) | (79) | H | H | H | H | $CH_3$ | $CH_3$ | $CONHCH_3$ | H | H | $CONHCH_3$ | H | H | H |
| (59) | (79) | H | H | H | H | $CH_3$ | $CH_3$ | $CONHC_2H_5$ | H | H | $CONHC_2H_5$ | H | H | H |
| (60) | (79) | H | H | H | H | $CH_3$ | $CH_3$ | $CONHC_3H_7(n)$ | H | H | $CONHC_3H_7(n)$ | H | H | H |
| (61) | (79) | H | H | H | H | $CH_3$ | $CH_3$ | $CON(C_2H_5)_2$ | H | H | $CON(C_2H_5)_2$ | H | H | H |
| (62) | (79) | H | H | H | H | $CH_3$ | $CH_3$ | $COOCH_3$ | H | H | H | H | H | H |
| (63) | (79) | H | H | H | H | $CH_3$ | $CH_3$ | H | $COOCH_3$ | H | H | H | H | H |
| (64) | (79) | H | H | H | H | $CH_3$ | $CH_3$ | H | H | $COOCH_3$ | H | H | H | H |
| (65) | (79) | H | H | H | H | $CH_3$ | $CH_3$ | H | $COOCH_3$ | H | $COOCH_3$ | H | H | H |
| (66) | (81) | H | H | H | H | $CH_3$ | $CH_3$ | $COOCH_3$ | H | H | $COOCH_3$ | H | H | H |
| (67) | (82) | H | H | H | H | $CH_3$ | $CH_3$ | $COOCH_3$ | H | H | $COOCH_3$ | H | H | H |

| Substitution position of $L_1$ in formulae (79) to (82) and structure of $L_1$ | | | Resin |
|---|---|---|---|
| 4-position | 5-position | 6-position | |
| $-\overset{H}{N}-\overset{O}{\underset{\|}{C}}-*$ | H | H | (A) |
| $-C_2H_5O-\overset{O}{\underset{\|}{C}}-*$ | H | H | (D) |
| $-C_2H_5O-\overset{O}{\underset{\|}{C}}-*$ | H | H | (D) |
| $-C_2H_5O-\overset{O}{\underset{\|}{C}}-*$ | H | H | (D) |
| $-C_2H_5O-\overset{O}{\underset{\|}{C}}-*$ | H | H | (D) |
| $-C_2H_5O-\overset{O}{\underset{\|}{C}}-*$ | H | H | (D) |
| $-C_2H_5O-\overset{O}{\underset{\|}{C}}-*$ | H | H | (D) |
| $-C_2H_5O-\overset{O}{\underset{\|}{C}}-*$ | H | H | (D) |
| $-C_2H_5O-\overset{O}{\underset{\|}{C}}-*$ | H | H | (D) |
| $-C_2H_5O-\overset{O}{\underset{\|}{C}}-*$ | H | H | (D) |

TABLE 2-2-continued

Polyester Having Bis-Azo Dye Skeleton

| | | | | |
|---|---|---|---|---|
| —C₂H₅O—C(=O)—* | H | H | (D) |
| —C₂H₅O—C(=O)—* | H | H | (D) |
| —C₂H₅O—C(=O)—* | H | H | (D) |
| —C₂H₅O—C(=O)—* | H | H | (D) |
| —C₂H₅O—C(=O)—* | H | H | (D) |
| —C₂H₅O—C(=O)—* | H | H | (D) |
| —C₂H₅O—C(=O)—* | H | H | (D) |

In Tables 2-1 and 2-2, the term "-position" refers to the substitution position in the formula (79), (80), (81), or (82) relative to the hydrazo group. The position of a substituent other than a hydrogen atom corresponds to the position of $L_1$ (for example, in the case of the polyester (35) having a bisazo skeleton, $L_1$ is located at a 4-position). Ph denotes an unsubstituted phenyl group. (n) and (i) denote that the corresponding alkyl group is linear and branched, respectively. "*" denotes a linkage between the linking group $L_1$ and the polyester resin. The formulae (79) to (82) in the column of the general formula have the following structures.

[Chem. 13]

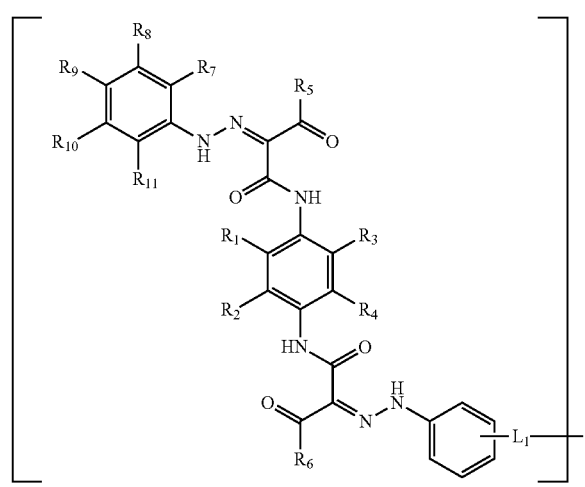

Formula (79)

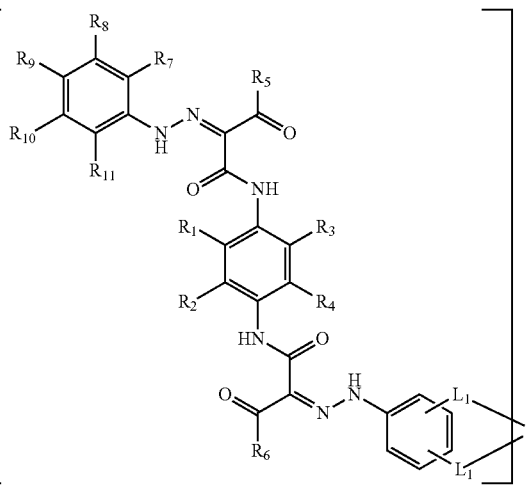

Formula (80)

Formula (81)

Formula (82)

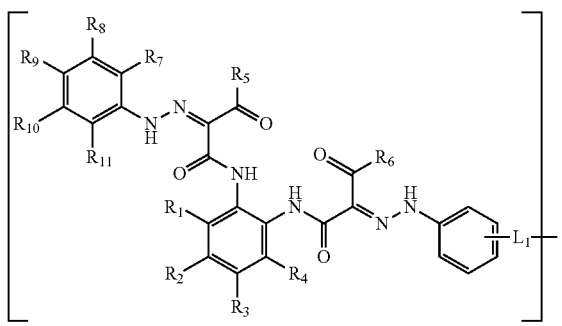

Compounds having azo dye skeletons represented by the following formula (83) and (84) were prepared by the method described above. The amidation between an amino group of these compounds and a carboxy group of the resin (A) yielded comparative compounds (83) and (84).

[Chem. 14]

Formula (83)

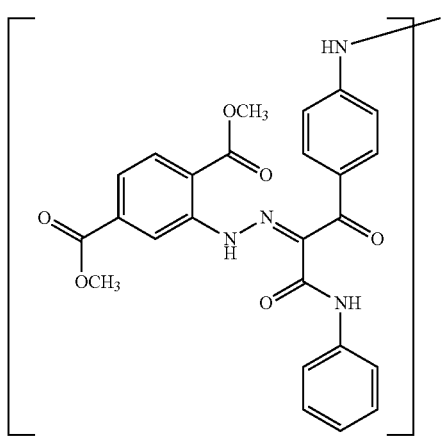

Formula (84)

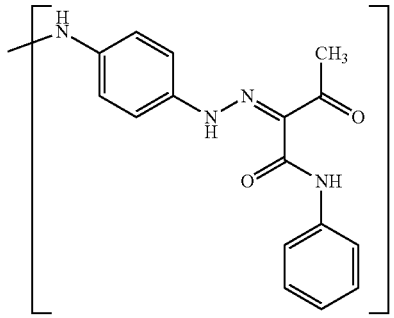

A pigment dispersion was prepared by the following method.

Preparation Example 1 of Pigment Dispersion 18.0 parts of an azo pigment having the formula (8), 3.6 parts of the polyester (35) having a bisazo dye skeleton serving as a pigment dispersant, 180 parts of a water-insoluble solvent styrene, and 130 parts of glass beads (having a diameter of 1 mm) were mixed in an attritor [manufactured by Nippon Coke & Engineering Co., Ltd.] for three hours and were passed through a mesh filter to yield a pigment dispersion (a).

Preparation Example 2 of Pigment Dispersion

Pigment dispersions (b) to (ag) were prepared in the same manner as Preparation Example 1 of Pigment Dispersion except that the polyester (35) having a bisazo dye skeleton was replaced with the polyesters (36) to (67), respectively.

Preparation Example 3 of Pigment Dispersion

Pigment dispersions (ah) and (ai) were prepared in the same manner as Preparation Example 1 of Pigment Dispersion except that styrene was replaced with toluene and butyl acrylate, respectively.

Preparation Example 4 of Pigment Dispersion

Pigment dispersions (aj) and (ak) were prepared in the same manner as Preparation Example 1 of Pigment Dispersion except that the pigment having the formula (8) was replaced with a pigment having the following formula (85) and (86), respectively.

[Chem. 15]

Formula (85)

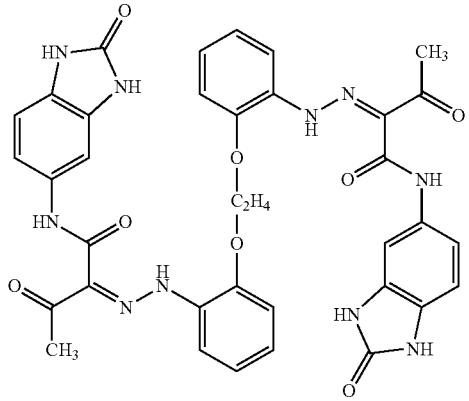

Formula (86)

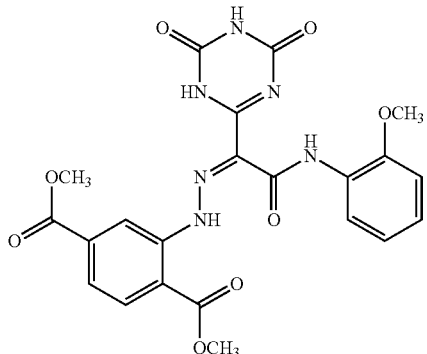

Reference pigment dispersions and comparative pigment dispersions were prepared by the following method.

Preparation Example 1 of Reference Pigment Dispersion

A reference pigment dispersion (al) was prepared in the same manner as Preparation Example 1 of Pigment Dispersion except that the polyester (35) having a bisazo dye skeleton was not used.

Preparation Example 2 of Reference Pigment Dispersion

Reference pigment dispersions (am) and (an) were prepared in the same manner as Preparation Example 3 of Pigment Dispersion except that the polyester (35) having a bisazo dye skeleton was not used.

Preparation Example 3 of Reference Pigment Dispersion

Reference pigment dispersions (ao) and (ap) were prepared in the same manner as Preparation Example 4 of Pigment Dispersion except that the polyester (35) having a bisazo dye skeleton was not used.

Preparation Example 1 of Comparative Pigment Dispersion

Comparative pigment dispersions (aq) to (as) were prepared in the same manner as Preparation Example 1 of Pigment Dispersion except that the polyester (35) having a bisazo dye skeleton was replaced with a polymer dispersant Solsperse 24000SC (registered trademark) [manufactured by Lubrizol Corp.] described in PTL 1 and the comparative compounds (83) and (84), respectively.

The pigment dispersions (a) to (ak) prepared using a polyester having a bisazo dye skeleton were evaluated by the following method.

Evaluation of Pigment Dispersibility

The pigment dispersing effect of a polyester having a bisazo dye skeleton was evaluated in a gloss test of a coating film of the pigment dispersion. The pigment dispersion was applied in a straight line with a dropper to an upper portion of a super art paper sheet [SA Kinfuji 180 kg 80×160, manufactured by Oji Paper Co., Ltd.] and was uniformly spread with a wire bar (#10). After drying, the gloss of the super art paper sheet (reflection angle: 60 degrees) was measured with a glossmeter Gloss Meter VG2000 [manufactured by Nippon Denshoku Industries Co., Ltd.]. Finer pigment dispersion results in a smoother coating film and higher gloss. The gloss for a reference pigment dispersion without a polyester having a bisazo dye skeleton was also measured in the same manner. An increase in the gloss of the pigment dispersion was determined with respect to the gloss of the reference pigment dispersion. An increase in the gloss of the pigment dispersions (a) to (ag) was determined with respect to the reference pigment dispersion (al). An increase in the gloss of the pigment dispersion (ah) was determined with respect to the reference pigment dispersion (am). An increase in the gloss of the pigment dispersion (ai) was determined with respect to the reference pigment dispersion (an). An increase in the gloss of the pigment dispersion (aj) was determined with respect to the reference pigment dispersion (ao). An increase in the gloss of the pigment dispersion (ak) was determined with respect to the reference pigment dispersion (ap).

A: An increase in gloss was 20% or more.
B: An increase in gloss was 10% or more and less than 20%.
C: An increase in gloss was 1% or more and less than 10%.
D: An increase in gloss was less than 1%, or the gloss was decreased.

An increase in gloss of 10% or more was considered to indicate satisfactory pigment dispersibility.

Table 3 shows the evaluation results for the pigment dispersions (a) to (ak).

An increase in the gloss of the comparative pigment dispersions (aq) to (as) was also determined in the same manner. Table 3 shows the evaluation results.

TABLE 3

Evaluation Results for Pigment Dispersion

| Pigment dispersion symbol | Polyester No. | Water-insoluble solvent | Pigment | Pigment dispersibility |
|---|---|---|---|---|
| (a) | (35) | Styrene | (8) | A(65) |
| (b) | (36) | Styrene | (8) | A(68) |
| (c) | (37) | Styrene | (8) | A(73) |
| (d) | (38) | Styrene | (8) | A(59) |
| (e) | (39) | Styrene | (8) | A(60) |
| (f) | (40) | Styrene | (8) | A(77) |
| (g) | (41) | Styrene | (8) | A(57) |
| (h) | (42) | Styrene | (8) | A(55) |
| (i) | (43) | Styrene | (8) | A(62) |
| (j) | (44) | Styrene | (8) | A(57) |
| (k) | (45) | Styrene | (8) | B(18) |
| (l) | (46) | Styrene | (8) | A(50) |
| (m) | (47) | Styrene | (8) | B(19) |
| (n) | (48) | Styrene | (8) | A(48) |
| (o) | (49) | Styrene | (8) | B(18) |
| (p) | (50) | Styrene | (8) | A(59) |
| (q) | (51) | Styrene | (8) | A(67) |
| (r) | (52) | Styrene | (8) | A(54) |
| (s) | (53) | Styrene | (8) | A(57) |
| (t) | (54) | Styrene | (8) | B(18) |
| (u) | (55) | Styrene | (8) | B(17) |
| (v) | (56) | Styrene | (8) | B(18) |
| (w) | (57) | Styrene | (8) | B(19) |
| (x) | (58) | Styrene | (8) | B(15) |
| (y) | (59) | Styrene | (8) | B(18) |
| (z) | (60) | Styrene | (8) | B(14) |
| (aa) | (61) | Styrene | (8) | B(19) |
| (ab) | (62) | Styrene | (8) | A(66) |
| (ac) | (63) | Styrene | (8) | B(15) |
| (ad) | (64) | Styrene | (8) | B(13) |
| (ae) | (65) | Styrene | (8) | B(18) |
| (af) | (66) | Styrene | (8) | A(58) |
| (ag) | (67) | Styrene | (8) | A(67) |
| (ah) | (35) | Toluene | (8) | A(42) |
| (ai) | (35) | Butyl acrylate | (8) | A(40) |
| (aj) | (35) | Styrene | (85) | B(16) |
| (ak) | (35) | Styrene | (86) | B(17) |
| (al) | None | Styrene | (8) | — |
| (am) | None | Toluene | (8) | — |
| (an) | None | Butyl acrylate | (8) | — |
| (ao) | None | Styrene | (85) | — |
| (ap) | None | Styrene | (86) | — |
| (aq) | Solsperse24000sc | Styrene | (8) | D(−2) |
| (ar) | Comparative compound (83) | Styrene | (8) | D(0) |
| (as) | Comparative compound (84) | Styrene | (8) | D(−5) |

Table 3 shows that the polyester having a bisazo dye skeleton can provide an azo pigment dispersion having satisfactory dispersibility and is useful as an azo pigment dispersant.

Preparation Example 5 of Pigment Dispersion 42.0 parts of the azo pigment having the formula (8) and 8.4 parts of the azo compound (35) serving as a pigment dispersant were dry-blended in a hybridization system NHS-0 [manufactured by Nara Machinery Co., Ltd.] to yield a pigment composition. A mixture of 18.0 parts of the pigment composition, 180 parts of styrene, and 130 parts of glass beads (having a diameter of 1 mm) was dispersed in a paint shaker [manufactured by Toyo Seiki Seisaku-Sho, Ltd.] for one hour and was passed through a mesh filter to yield a pigment dispersion. The pigment dispersibility of the pigment dispersion was evaluated in the same manner as described above. The pigment dispersion had satisfactory pigment dispersibility.

An ink was prepared by the following method.

Preparation Example 1 of Ink

A mixture of the following components and 90.00 parts of glass beads (having a diameter of 1 mm) was dispersed in an attritor [manufactured by Nippon Coke & Engineering Co., Ltd.] for three hours and was passed through a mesh filter to yield an ink (1).

C.I. Pigment Green 36: 6.00 parts
Pigment having the formula (8): 4.00 parts
Polyester (35) having bisazo dye skeleton: 2.00 parts
Diethylene glycol monobutyl ether acetate: 70.00 parts Preparation Example 2 of Ink Inks (2) to (10) were prepared in the same manner as Preparation Example 1 of Ink except that the polyester (35) having a bisazo dye skeleton was replaced with the polyesters (38), (45), (46), (50), (52), (53), (64), (66), and (67), respectively.

Preparation Example 3 of Ink

Inks (11) and (12) were prepared in the same manner as Preparation Example 1 of Ink except that the pigment having the formula (8) was replaced with the pigments having the formulae (85) and (86), respectively.

Reference inks and comparative inks were prepared by the following method.

Preparation Example 1 of Reference Ink

A reference ink (13) was prepared in the same manner as Preparation Example 1 of Ink except that the polyester (35) having a bisazo dye skeleton was not used.

Preparation Example 2 of Reference Ink

Reference inks (14) and (15) were prepared in the same manner as Preparation Example 3 of Ink except that the polyester (35) having a bisazo dye skeleton was not used.

Preparation Example 1 of Comparative Ink

Comparative inks (16) to (18) were prepared in the same manner as Preparation Example 1 of Ink except that the polyester (35) having a bisazo dye skeleton was replaced with a polymer dispersant Solsperse 24000SC (registered trademark) [manufactured by Lubrizol Corp.] described in PTL 1 and the comparative compounds (83) and (84), respectively.

A color filter resist composition was prepared by the following method.

Preparation Example 1 of Color Filter Resist Composition

Methylated benzoguanamine resin: 15.00 parts [manufactured by Sanwa Chemical Co., Ltd.] (binder resin)
Diethylene glycol monobutyl ether acetate: 40.00 parts A solution of these components was slowly added to the ink (1) and was stirred at room temperature for three hours. The resulting mixture was passed through a 1.5-μm filter to prepare a color filter resist composition (a).

Preparation Example 2 of Color Filter Resist Composition

Color filter resist compositions (b) to (j) were prepared in the same manner as Preparation Example 1 of Color Filter Resist Composition except that the ink (1) was replaced with the inks (2) to (10), respectively.

Preparation Example 3 of Color Filter Resist Composition

Color filter resist compositions (k) and (l) were prepared in the same manner as Preparation Example 1 of Color Filter Resist Composition except that the ink (1) was replaced with the inks (11) and (12), respectively.

Reference color filter resist compositions and comparative color filter resist compositions were prepared by the following method.

Preparation Example 1 of Reference Color Filter Resist Composition

A reference color filter resist composition (m) was prepared in the same manner as Preparation Example 1 of Color Filter Resist Composition except that the ink (1) was replaced with the ink (13).

Preparation Example 2 of Reference Color Filter Resist Composition

Reference color filter resist compositions (n) and (o) were prepared in the same manner as Preparation Example 1 of Color Filter Resist Composition except that the ink (1) was replaced with the inks (14) and (15), respectively.

Preparation Example 1 of Comparative Color Filter Resist Composition

Comparative color filter resist compositions (p) to (r) were prepared in the same manner as Preparation Example 1 of Color Filter Resist Composition except that the ink (1) was replaced with the inks (16) to (18), respectively.

Color filter resist compositions and comparative color filter resist compositions prepared using a polyester having a bisazo dye skeleton were tested by the following method.

Evaluation of Color Characteristics

The color characteristics of the color filter resist compositions (a) to (l) prepared using a polyester having a bisazo dye skeleton were evaluated by ejecting the resist compositions onto a glass substrate using an ink jet coating apparatus and performing a brightness test. A color filter resist composition in a cartridge was ejected onto a glass substrate on which pixels defined by a black matrix were formed, and was dried at 180° C. for two hours. The film thickness of a green filter was adjusted so as to satisfy y=0.6. The color characteristics (x, y, Y) were measured with a microspectrophotometer. A more finely dispersed pigment has higher brightness Y in the green chromaticity. An increase in the brightness Y of green filters of the color filter resist compositions (a) to (l) was determined relative to the brightness Y of green filters of the color filter resist compositions (m) to (o) without a polyester having a bisazo dye skeleton. An increase in brightness for the color filter resist compositions (a) to (j) was determined with respect to the reference color filter resist composition (m). An increase in brightness for the color filter resist composition (k) was determined with respect to the reference color filter resist composition (n). An increase in brightness for the color filter resist composition (l) was determined with respect to the reference color filter resist composition (o). An increase in brightness of 10% or more was considered to indicate satisfactory color characteristics.

A: An increase in brightness was 20% or more.

B: An increase in brightness was 10% or more and less than 20%.

C: An increase in brightness was 1% or more and less than 10%.

D: An increase in brightness was less than 1%, or the brightness was decreased.

Table 4 shows the evaluation results for the color filter resist compositions (a) to (l).

An increase in brightness for the comparative color filter resist compositions (p) to (r) was also determined in the same manner. Table 4 shows the evaluation results.

TABLE 4

Evaluation Results for Color Filter Resist Composition

| Resist composition symbol | Ink No. | Polyester No. | Pigment | Rating of color characteristics |
|---|---|---|---|---|
| (a) | (1) | (35) | (8) | A(26) |
| (b) | (2) | (38) | (8) | A(23) |
| (c) | (3) | (45) | (8) | A(24) |
| (d) | (4) | (46) | (8) | A(28) |
| (e) | (5) | (50) | (8) | A(27) |
| (f) | (6) | (52) | (8) | A(25) |
| (g) | (7) | (53) | (8) | A(28) |
| (h) | (8) | (64) | (8) | B(16) |
| (i) | (9) | (66) | (8) | A(22) |
| (j) | (10) | (67) | (8) | A(21) |
| (k) | (11) | (35) | (85) | B(18) |
| (l) | (12) | (35) | (86) | B(17) |
| (m) | (13) | None | (8) | — |
| (n) | (14) | None | (85) | — |
| (o) | (15) | None | (86) | — |
| (p) | (16) | Solsperse24000sc | (8) | D(0) |
| (q) | (17) | Comparative compound (83) | (8) | D(−3) |
| (r) | (18) | Comparative compound (84) | (8) | D(0) |

Table 4 shows that the color filter resist compositions (a) to (l) have satisfactory pigment dispersibility and excellent color characteristics. Thus, pigment dispersions according to embodiments of the present invention are useful as colorants for inks and color filter resist compositions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-246929, filed Nov. 10, 2011, which is hereby incorporated by reference herein in its entirety.

The invention claimed is:

1. A compound, comprising: a polyester moiety; and a bisazo structure moiety having the following formula (1) or (2):

[Chem. 1]

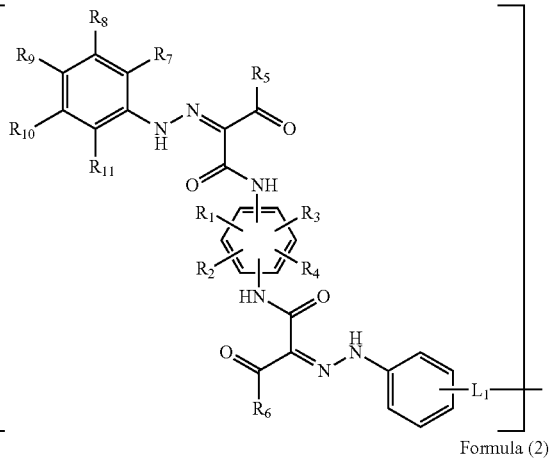

Formula (1)

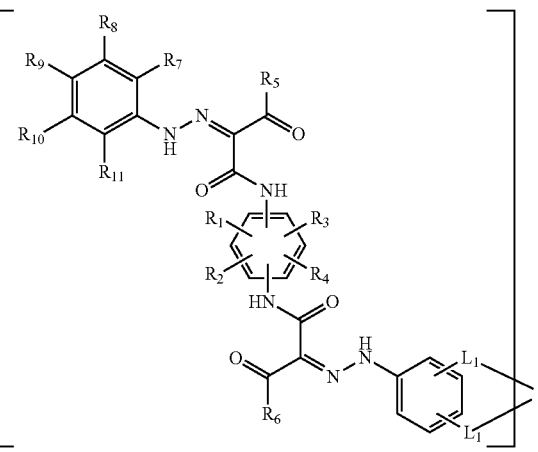

Formula (2)

wherein $R_1$ to $R_4$ independently denote a hydrogen atom or a halogen atom, $R_5$ and $R_6$ independently denote an alkyl group having 1 to 6 carbon atoms or a phenyl group, $R_7$ to $R_{11}$ independently denote a hydrogen atom, a $COOR_{12}$ group, or a $CONR_{13}R_{14}$ group, provided that at least one of $R_7$ to $R_{11}$ denotes the $COOR_{12}$ group or the $CONR_{13}R_{14}$ group, $R_{12}$ to $R_{14}$ independently denote a hydrogen atom or an alkyl group having 1 to 3 carbon atoms, and $L_1$ denotes a divalent linking group to be bonded to the polyester moiety.

2. The compound according to claim 1, wherein $R_5$ and $R_6$ denote a methyl group.

3. The compound according to claim 1, wherein $R_7$ and $R_{10}$ denote $COOR_{12}$, and $R_8$, $R_9$, and $R_{11}$ denote a hydrogen atom.

4. The compound according to claim 1, wherein $L_1$ denotes a linking group having a carboxylate bond, a carboxylic acid amide bond, or a sulfonate bond.

5. The compound according to claim 1, wherein the compound has the bisazo structure moiety having the formula (1), and the bisazo structure moiety having the formula (1) has the following formula (7).

[Chem. 2]

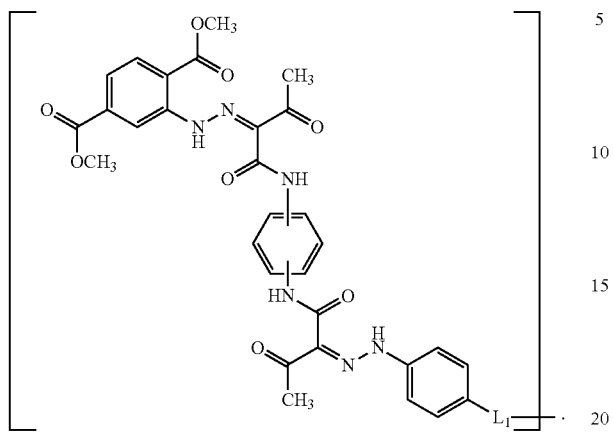

Formula (7)

6. A pigment composition, comprising: the compound according to claim 1; and an azo pigment.

7. The pigment composition according to claim 6, wherein the azo pigment has the following formula (8).

[Chem. 9]

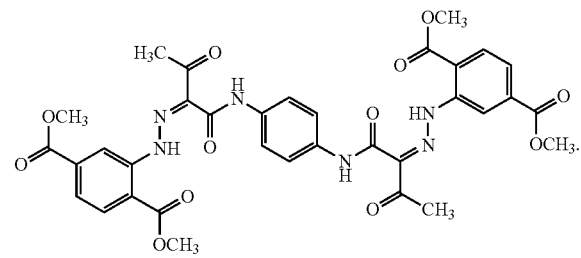

Formula (8)

8. A pigment dispersion, comprising: the compound according to claim 1; an azo pigment; and a water-insoluble solvent.

9. The pigment dispersion according to claim 8, wherein the azo pigment has the following formula (8).

[Chem. 9]

Formula (8)

10. An ink, comprising the pigment dispersion according to claim 8.

11. A color filter resist composition, comprising: the pigment dispersion according to claim 8; and a binder resin.

* * * * *